(12) United States Patent
Yoshihara

(10) Patent No.: US 10,483,216 B2
(45) Date of Patent: Nov. 19, 2019

(54) POWER MODULE AND FABRICATION METHOD FOR THE SAME

(71) Applicant: ROHM CO., LTD., Kyoto-shi, Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/372,123

(22) Filed: Dec. 7, 2016

(65) Prior Publication Data

US 2017/0092596 A1   Mar. 30, 2017

Related U.S. Application Data

(63) Continuation of application No. PCT/JP2015/066886, filed on Jun. 11, 2015.

(30) Foreign Application Priority Data

Jun. 13, 2014 (JP) .................................. 2014-122054

(51) Int. Cl.
*H01L 23/00* (2006.01)
*H01L 21/48* (2006.01)
*H01L 23/495* (2006.01)

(52) U.S. Cl.
CPC ........ *H01L 23/562* (2013.01); *H01L 21/4825* (2013.01); *H01L 21/4839* (2013.01);
(Continued)

(58) Field of Classification Search
CPC ......... H01L 23/49548; H01L 23/49558; H01L 23/4952; H01L 23/49513; H01L 23/49582;
(Continued)

(56) References Cited

U.S. PATENT DOCUMENTS 6,249,041 B1 * 6/2001 Kasem ................ H01L 23/4951
257/666
2010/0308421 A1 * 12/2010 Muto .................... H01L 25/074
257/401
(Continued)

FOREIGN PATENT DOCUMENTS

JP    05-160339 A    6/1993
JP    3201277       6/2001
(Continued)

OTHER PUBLICATIONS

International Search Report, dated Sep. 8, 2015, PCT/JP2015/066886 with English translation (5 pages).

*Primary Examiner* — Ermias T Woldegeorgis
(74) *Attorney, Agent, or Firm* — Hamre, Schumann, Mueller & Larson, P.C.

(57) ABSTRACT

The power module includes: a ceramics substrate; a source electrode pattern, a drain electrode pattern, a source signal electrode pattern, and a gate signal electrode pattern respectively disposed on the ceramics substrate; a semiconductor device disposed on the drain electrode pattern, the semiconductor device comprising a source pad electrode and a gate pad electrode at a front surface side; a divided leadframe for source bonded to the source electrode pattern and the source pad electrode; and a divided leadframe for gate pad electrode bonded to a gate pad electrode. There is provided a power module having a simplified structure, fabricated through a simplified process, and capable of conducting a large current; and a fabrication method for such a power module.

18 Claims, 26 Drawing Sheets

(52) U.S. Cl.
CPC .... *H01L 23/4952* (2013.01); *H01L 23/49513* (2013.01); *H01L 23/49548* (2013.01); *H01L 23/49558* (2013.01); *H01L 23/49562* (2013.01); *H01L 23/49582* (2013.01)

(58) Field of Classification Search
CPC ........... H01L 23/49562; H01L 21/4825; H01L 21/4839
See application file for complete search history.

(56) References Cited

U.S. PATENT DOCUMENTS

2013/0027113 A1\* 1/2013 Otremba ........... H01L 23/49524
 327/423
2014/0159054 A1\* 6/2014 Otake .................... H01L 23/48
 257/77

FOREIGN PATENT DOCUMENTS

| | | |
|---|---|---|
| JP | 2002-076254 A | 3/2002 |
| JP | 2005-109100 | 4/2005 |
| JP | 2005-183463 | 7/2005 |
| JP | 2008-091618 A | 4/2008 |
| JP | 2010-283236 A | 12/2010 |
| JP | 2011-172482 A | 9/2011 |
| JP | 2013-065620 A | 4/2013 |
| JP | 2013-172044 | 9/2013 |
| JP | 2013-179229 | 9/2013 |

\* cited by examiner

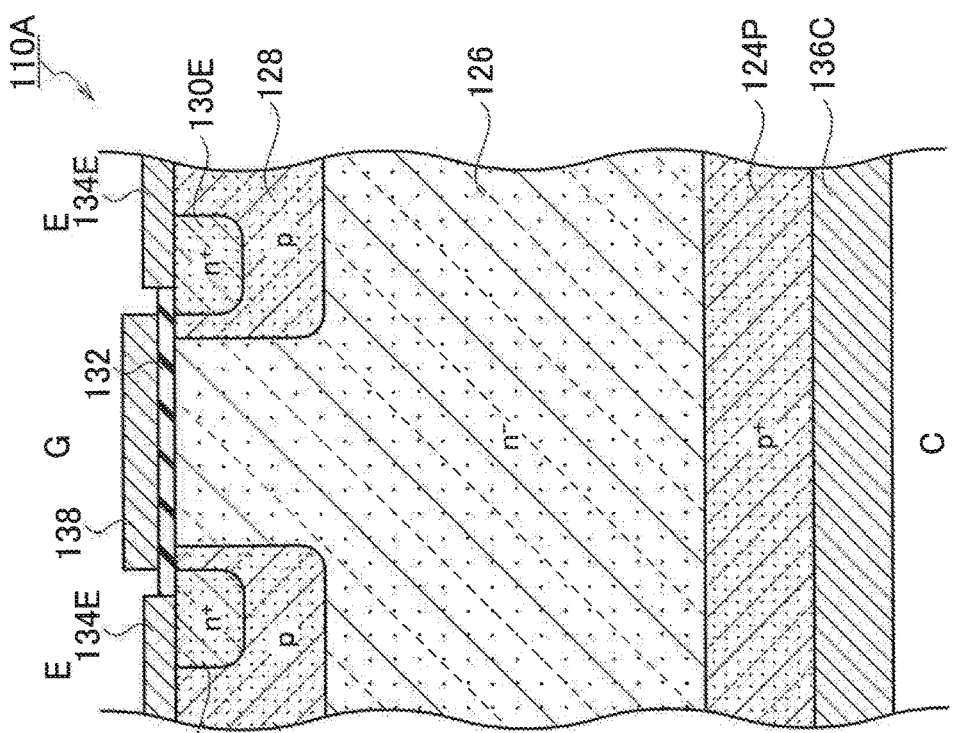
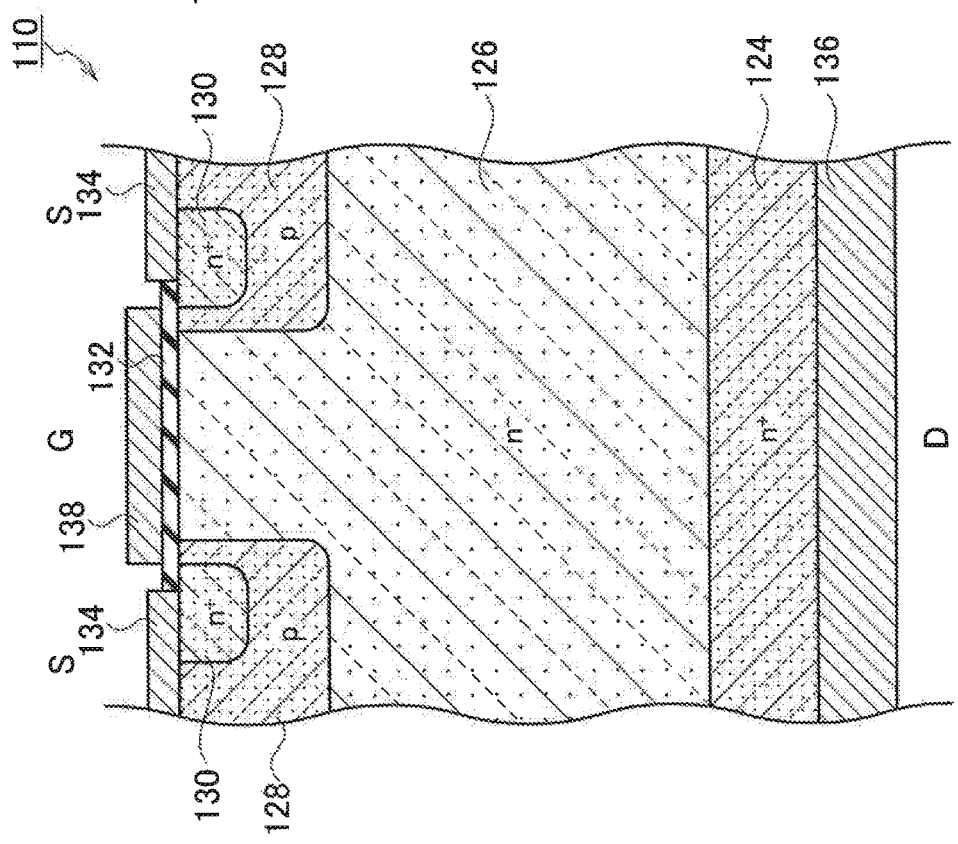

POWER MODULE AND FABRICATION METHOD FOR THE SAME

CROSS REFERENCE TO RELATED APPLICATIONS

This is a continuation application (CA) of PCT Application No. PCT/JP2015/066886, filed on Jun. 11, 2015, which claims priority to Japan Patent Application No. P2014-122054 filed on Jun. 13, 2014 and is based upon and claims the benefit of priority from prior Japanese Patent Application No. P2014-122054 filed on Jun. 13, 2014 and PCT Application No. PCT/JP2015/066886, filed on Jun. 11, 2015, the entire contents of each of which are incorporated herein by reference.

FIELD

The embodiments described herein relate to a power module and a fabrication method for such a power module.

BACKGROUND

Conventionally, there have been known power modules in which a power chip including a semiconductor device such as Insulated Gate Bipolar Transistor (IGBT) is mounted on a leadframe therein, and of which the whole system thereof is molded with resin. Since such a semiconductor device produces heat during an operating state, it is common to dispose a heat sink via an insulating layer on a back side surface of the leadframe in order to cool the semiconductor device.

Many research institutions are currently conducting research to develop Silicon Carbide (SiC) devices. Advantages of SiC power devices over Si power devices include low on resistance, high switching speed, high temperature operation characteristics, etc.

SiC power modules can conduct a large electric current, and can be easily operated under high temperature conditions operation, since losses produced by Si power devices are relatively smaller. However, power module design has been required for achieving such SiC power modules.

Case type packages is used as packages of the SiC power devices. Moreover, there has been also disclosed a semiconductor device which is resin-sealed by transfermold technique.

Moreover, in a field of SiC power devices including pillar electrode structure on a main electrode, there have been also proposed: power modules wherein an amount of warping of thin type SiC power modules is reduced by adjusting linear thermal expansion; and SiC power modules having improved thermal resistance.

SUMMARY

The embodiments provide: a power module having a simplified structure, fabricated through a simplified process, and capable of conducting a large current; and a fabrication method for such a power module.

According to one aspect of the embodiments, there is provided a power module comprising: a semiconductor device; and a leadframe bonded to an upper surface of the semiconductor device, wherein the leadframe is divided into a plurality of leadframes, wherein the leadframe divided into the plurality of frames includes: a first leadframe configured to conduct a principal current, and a second leadframe electrically insulated from the first leadframe.

According to another aspect of the embodiments, there is provided a fabrication method for a power module, the fabrication method comprising: forming a first electrode pattern, a second electrode pattern, a first signal electrode pattern, and a second signal electrode pattern on a substrate; forming a semiconductor device on the second electrode pattern, the semiconductor device comprising a first pad electrode and a second pad electrode at a front surface side; assembling a first leadframe, a second leadframe, and an insulating portion; and bonding a first leadframe to the first electrode pattern and the first pad electrode, and bonding a second leadframe to the second pad electrode.

According to still another aspect of the embodiments, there is provided a fabrication method for a power module, the fabrication method comprising: forming a first electrode pattern, a second electrode pattern, a first signal electrode pattern, and a second signal electrode pattern on a substrate; assembling a first leadframe, a second leadframe, and an insulating portion; and forming a semiconductor device on the second electrode pattern, the semiconductor device comprising a first pad electrode and a second pad electrode at a front surface side, and bonding the first leadframe to the first electrode pattern and the first pad electrode, and bonding the second pad electrode and the second leadframe.

According to the embodiments, there can be provided the power module having the simplified structure, fabricated through the simplified process, and capable of conducting the large current; and the fabrication method for such a power module.

BRIEF DESCRIPTION OF DRAWINGS

FIG. 23A is a schematic cross-sectional structure diagram of the SiC MISFET, which is an example of a semiconductor device to be applied to the power module according to the embodiments.

FIG. 23B is a schematic cross-sectional structure diagram of the IGBT, which is an example of the semiconductor device to be applied to the power module according to the embodiments.

DESCRIPTION OF EMBODIMENTS

Figure 1A:
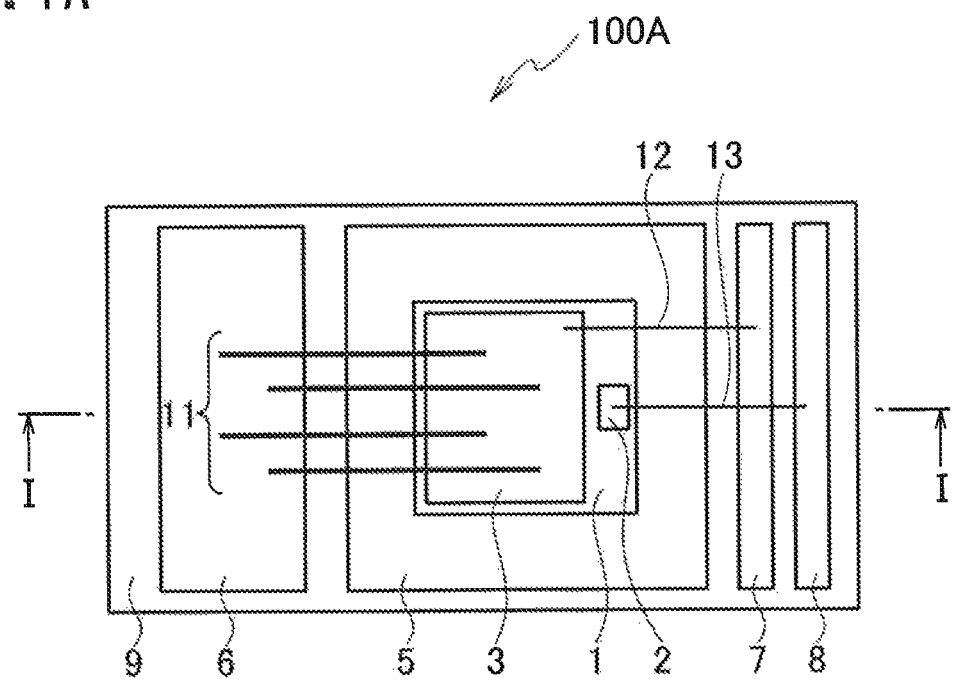
FIG. 1A is a schematic planar pattern configuration diagram showing a principal portion of a power module according to a comparative example 1.

Next, certain embodiments will now be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation.

Of course, the part from which the relation and ratio of a mutual size differ also in mutually drawings is included. Moreover, the embodiments shown hereinafter exemplify the apparatus and method for materializing the technical idea; and the embodiments does not specify the material, shape, structure, placement, etc. of each component part as the following.

[Comparative Example]

—Comparative Example 1—

Figure 1B:
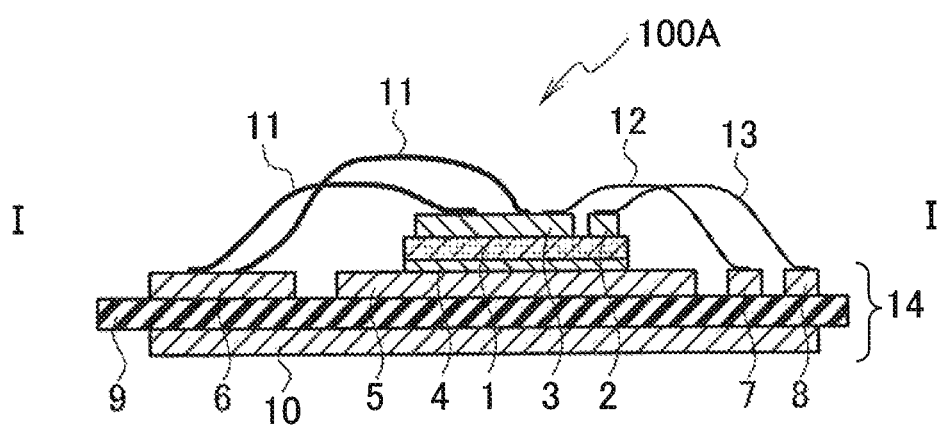
FIG. 1B is a schematic cross-sectional structure diagram taken in the line I-I of FIG. 1A.

FIG. 1A shows a schematic planar pattern configuration of a principal portion of a power module 100A according to a comparative example 1, and FIG. 1B shows a schematic cross-sectional structure taken in the line I-I of FIG. 1A.

As shown in FIGS. 1A and 1B, the power module 100A according to the comparative example I includes: a ceramics substrate 9; a source electrode pattern 6, a drain electrode pattern 5, a source signal electrode pattern 7, and a gate signal electrode pattern 8 respectively disposed on the ceramics substrate 9; a semiconductor device 1 disposed on the drain electrode pattern 5, the semiconductor device 1 including a source pad electrode 3 and a gate pad electrode 2 at a front surface side; source bonding wires 11 connected between the source electrode pattern 6 and the source pad electrode 3; a source signal bonding wire 12 connected between the source electrode pattern 6 and the source signal electrode pattern 7; and a gate signal bonding wire 13 connected between the gate pad electrode 2 and the gate signal electrode pattern 8. The source signal bonding wire 12 naturally should not be illustrated since FIG. 1B shows the cross-sectional structure taken in the line I-I of FIG. 1A, but the source signal bonding wire 12 is illustrated with the gate signal bonding wire 13 in FIG. 1B in order to make the connecting relationship therebetween easy to visually see.

The semiconductor device 1 is bonded to a drain electrode pattern (copper foil) 5 through a soldering layer 4 under chip. The drain electrode pattern 5 is bonded to the ceramics substrate 9 with the metallic foils of the source electrode pattern 6, the source signal electrode pattern 7, the gate signal electrode pattern 8, and a back surface electrode pattern 10, so as to be integrated as an insulating substrate 14.

The source pad electrode 3 and the gate pad electrode 2 are formed on a front side surface of the semiconductor device 1, and the source pad electrode 3 and the source electrode pattern 6 are electrically connected to each other with the source bonding wires 11. Moreover, the gate pad electrode 2 and the gate signal electrode pattern 8 are electrically connected to each other with the gate signal bonding wire 13. Furthermore, the source pad electrode 3 and the source signal electrode pattern 7 are electrically connected to each other with the source signal bonding wire 12.

An aluminum wire measuring approximately $\varphi=400$ µm in diameter is ordinarily used for the source bonding wire 11, and the maximum current which can be conducted is approximately 25A per one wire. For example, in the case of using the aluminum wire measuring approximately $\varphi=400$ µm in diameter, the number of the wires to be bonded to the source pad electrode 3 disposed on the surface of the semiconductor chip measuring 4 mm squares is up to approximately four at the maximum. Accordingly, the maximum current can be conducted to the semiconductor chip of measuring 4 mm squares is approximately 25 A×4=100 A. Since the aluminum wires may be fused if a further current is conducted thereto, it is necessary to increase the number of the aluminum wires or to increase the diameter $\varphi$ of the aluminum wires. However, since an area of the source pad electrode 3 on the front side surface of the semiconductor chip 1 is limited, it is also difficult to increase the number of the aluminum wires, or to increase the diameter $\varphi$ of the aluminum wires.

—Comparative Example2—

Figure 2A:
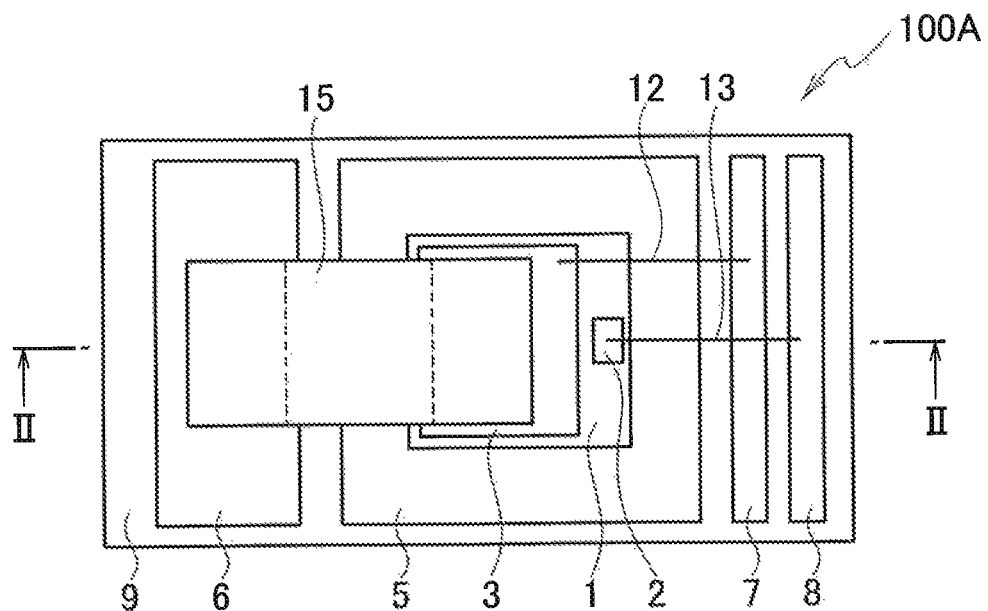
FIG. 2A is a schematic planar pattern configuration diagram showing a principal portion of a power module according to a comparative example 2.
Figure 2B:
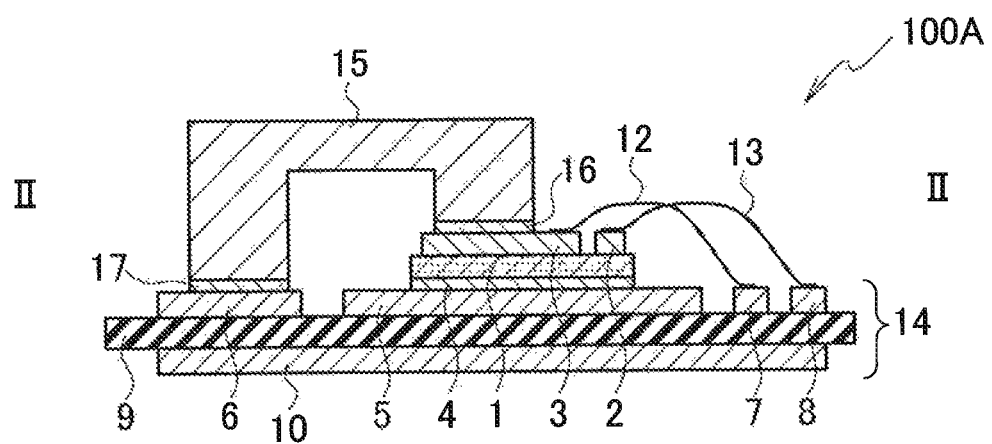
FIG. 2B is a schematic cross-sectional structure diagram taken in the line II-II of FIG. 2A.
Figure 3:
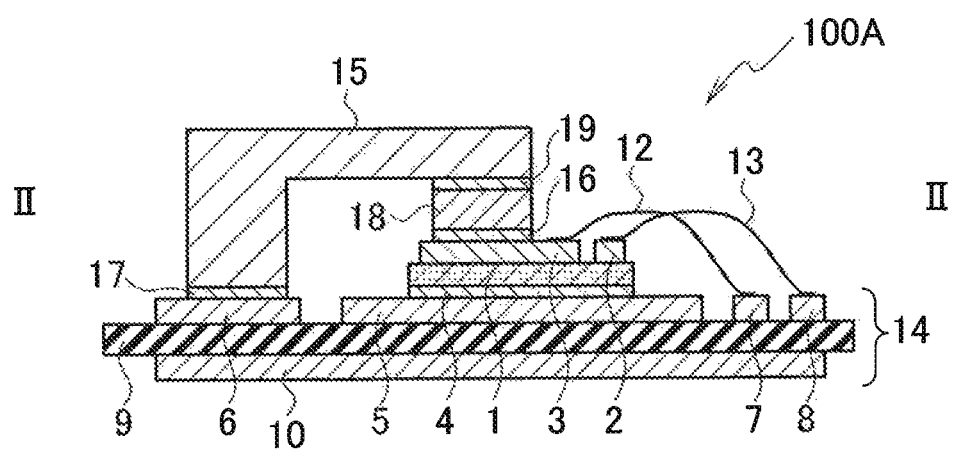
FIG. 3 is a schematic cross-sectional structure diagram taken in the line II-II of FIG. 2A, which is a power module according to a modified example of the comparative example 2.

FIG. 2A shows a schematic planar pattern configuration of a principal portion of a power module 100A according to a comparative example 2, and FIG. 2B shows a schematic cross-sectional structure taken in the line II-II of FIG. 2A. Moreover, FIG. 3 shows a schematic cross-sectional structure taken in the line II-II of FIG. 2A, which is a power module 100A according to a modified example of the comparative example 2.

As shown in FIGS. 2A and 2B, the power module 100A according to a comparative example 2 includes: a ceramics substrate 9; a source electrode pattern 6, a drain electrode pattern 5, a source signal electrode pattern 7, and a gate signal electrode pattern 8 respectively disposed on the ceramics substrate 9; a semiconductor device 1 disposed on the drain electrode pattern 5, the semiconductor device 1 including a source pad electrode 3 and a gate pad electrode 2 at a front surface side; a leadframe 15 connected between the source electrode pattern 6 and the source pad electrode 3; a source signal bonding wire 12 connected between the source electrode pattern 6 and the source signal electrode pattern 7; and a gate signal bonding wire 13 connected between the gate pad electrode 2 and the gate signal electrode pattern 8. The source signal bonding wire 12 naturally should not be illustrated since FIG. 2B shows the cross-sectional structure taken in the line II-II of FIG. 2A, but the source signal bonding wire 12 is illustrated with the gate signal bonding wire 13 in FIG. 1B in order to make the connecting relationship therebetween easy to visually see.

As shown in FIGS. 2A and 2B, in the leadframe wiring the leadframe 15 is connected to the source pad electrode 3 disposed on a front side surface of the semiconductor device 1 via a soldering layer 16 on chip, instead of the aluminum wires. Moreover, the leadframe 15 is connected to the source electrode pattern 6 via a soldering layer 17 on source electrode pattern. As materials of the leadframe 15, copper, copper alloys, etc. having high electric conductivity are applicable.

Moreover, since a difference of coefficient of thermal expansion between the leadframe 15 and the semiconductor device 1 is relatively large, relatively large stress loading (stress) is applied to the soldering layer 16 on chip under an environment of repeating cooling and heating, and thereby a fault causing occurrence of a crack may occur in the soldering layer 16 on chip. Accordingly, as shown in FIG. 3, a structure including a stress relaxation layer 18 intervened between the leadframe 15 and the semiconductor device 1 may be adopted, in the modified example of the comparative example 2. In this case, the leadframe 15 is connected to the stress relaxation layer 18 via a soldering layer 19 on stress relaxation layer.

Since a conducting area of electric current can be increased in such leadframe structures compared with the wirings using aluminum wires, it is possible to flow much currents more than the case of the aluminum wires. On the other hand, efficiency of fabricating process suffers, since it is necessary to connect the gate signal bonding wire 13 between the gate pad electrode 2 and the gate signal electrode pattern 8, and to connect the source signal bonding wire 12 between the source pad electrode 3 and the source signal electrode pattern 7. For example, in the structure of the comparative example 2 shown in FIG. 2, it is necessary to connect respectively the source signal bonding wire 12 and the gate signal bonding wire 13 therebetween after soldering the semiconductor device 1 on the insulating substrate 14, and then to solder the leadframe 15 thereon. If the leadframe 15 is soldered thereon before the source signal bonding wire 12 and the gate signal bonding wire 13 are connected therebetween, a bonding tool (e.g., capillary etc.) for the aluminum wire bonding may interfere with the leadframe 15. Accordingly, the source signal bonding wire 12 and the gate signal bonding wire 13 have to be bonded thereto before the connection of the leadframe 15.

Accordingly, a fabrication method of the power module 100A according to the comparative example 2 need to include: soldering the semiconductor device 1 on the insulating substrate 14; connecting respectively the source signal bonding wire 12 and the gate signal bonding wire 13 therebetween; and soldering the leadframe 15 thereon.

[First Embodiment]

(Power Module)

Figure 4A:
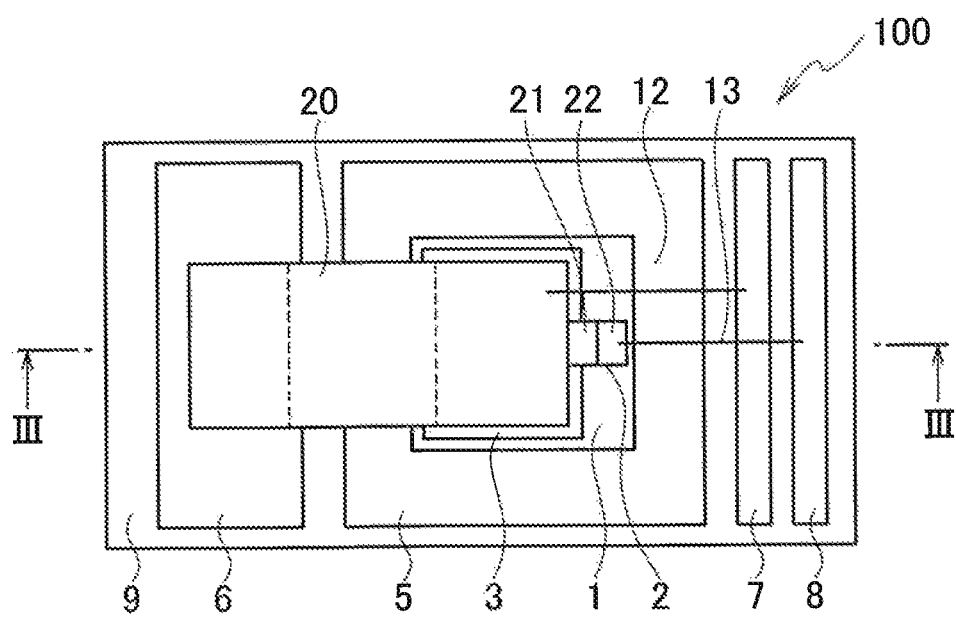
FIG. 4A is a schematic planar pattern configuration diagram showing a principal portion of a power module according to the first embodiment.
Figure 4B:
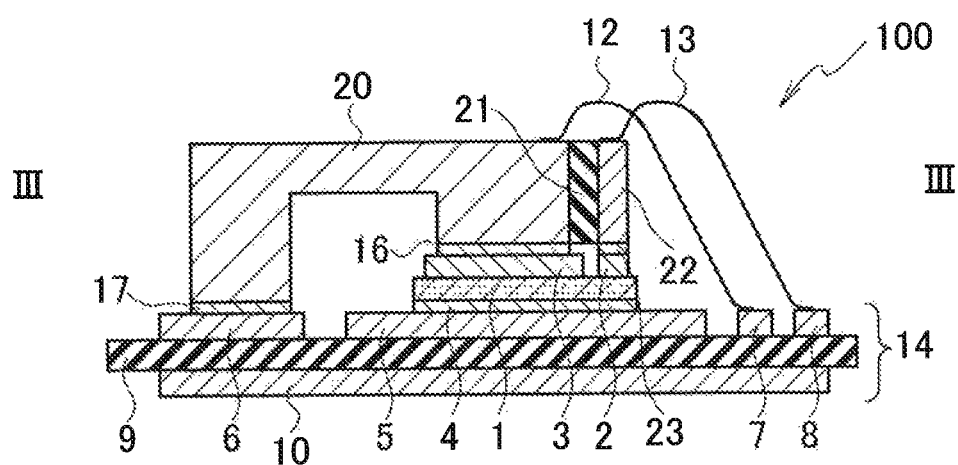
FIG. 4B is a schematic cross-sectional structure diagram taken in the line III-III of FIG. 4A.

FIG. 4A shows a schematic planar pattern configuration of a principal portion of a power module 100 according to a first embodiment, and FIG. 4B shows a schematic cross-sectional structure taken in the line III-III of FIG. 4A.

As shown in FIGS. 4A and 4B, the power module 100 according to the first embodiment includes: a semiconductor device 1; and a leadframe (20, 22) configured to be bonded to an upper surface of the semiconductor device 1. In the embodiment, the leadframe (20, 22) is divided into a plurality of leadframes.

The leadframe (20, 22) divided into the plurality of frames includes: a first leadframe 20 configured to conduct a principal current, and a second leadframe 22 electrically insulated from the first leadframe 20.

As shown in FIGS. 4A and 4B, the power module 100 according to the first embodiment includes an insulating portion 21, and assembling connection between the first leadframe 20 and the second leadframe 22 is performed via the insulating portion 21. Note that the source signal bonding wire 12 naturally should not be illustrated since FIG. 4B shows the cross-sectional structure taken in the line III-III of FIG. 4A, but the source signal bonding wire 12 is illustrated with the gate signal bonding wire 13 in FIG. 1B in order to make the connecting relationship therebetween easy to visually see.

More particularly, as shown in FIGS. 4A and 4B, the power module 100 according to the first embodiment includes: a ceramics substrate 9; a source electrode pattern 6, a drain electrode pattern 5, a source signal electrode pattern 7, and a gate signal electrode pattern 8 respectively disposed on the ceramics substrate 9; a semiconductor device 1 disposed on the drain electrode pattern 5, the semiconductor device 1 including a source pad electrode 3 and a gate pad electrode 2 at a front surface side; a divided leadframe 20 for source configured to be bonded to the source electrode pattern 6 and the source pad electrode 3; and a divided leadframe 22 for gate pad electrode configured to be bonded to a gate pad electrode 2.

As shown in FIGS. 4A and 4B, the power module 100 according to the first embodiment includes: a source signal bonding wire 12 connecting between the divided leadframe 20 for source and the source signal electrode pattern 7; and a gate signal bonding wire 13 connecting between the divided leadframe 22 for gate pad electrode and the gate signal electrode pattern 8.

As shown in FIGS. 4A and 4B, in the power module 100 according to the first embodiment, assembling connection between the divided leadframe 20 for source and the divided leadframe 22 for gate pad electrode is performed via the insulating portion (dividing portion) 21.

In the power module 100 according to the first embodiment, divided leadframe structure (20, 22) is bonded by soldering to the source pad electrode 3 and the gate pad electrode 2 on the upper surface of the semiconductor device 1. In this case, the divided leadframe 20 for source and the divided leadframe 22 for gate pad electrode are insulated from each other by an insulating portion (dividing portion) 21, and are connected to each other. The divided leadframe 20 for source can conduct the principal current from the semiconductor device 1. On the other hand, a gate signal (voltage) from the gate pad electrode 2 is applied to the divided leadframe 22 for gate pad electrode insulated via the insulating portion (dividing portion) 21 from the divided leadframe 20 for source.

Insulating materials resistant to a solder fusion temperature fused at approximately 180 degrees C. (Celsius) can be applied to the materials of the insulating portion (dividing portion) 21, for example. For example, an epoxy based resin and a silicone based resin are applicable thereto. Moreover, an insulating breakdown voltage applied between the divided leadframe 20 for source and the divided leadframe 22 for gate pad electrode is approximately 20V, for example. Accordingly, in the light of a surge capacitivity, it is effective for the insulating portion (dividing portion) 21 to holds a breakdown voltage of approximately 60V approximately 3 times as much as approximately 20V.

Cu, Al, a Cu alloy, an Al alloy, or an alloy containing at least one of such metals can be applied, as materials of the divided leadframe 20 for source capable of conduct the principal current.

Cu, Al, CuMo, etc. can be applied, as materials of the divided leadframe 22 for gate pad electrode to which the signal voltage is applied.

(Fabrication Method)

Figure 5A:
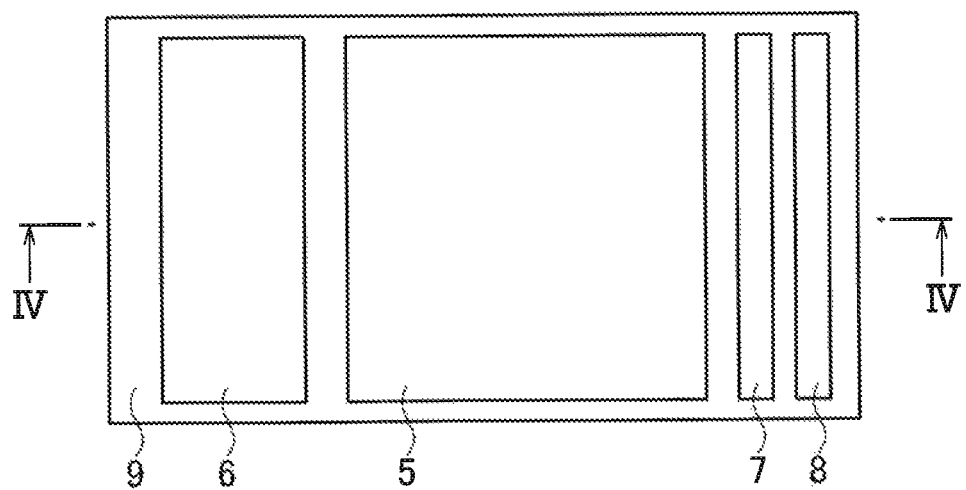
FIG. 5A is a schematic planar pattern configuration diagram for explaining one process of a fabrication method for the power module according to the first embodiment (Phase 1).
Figure 5B:
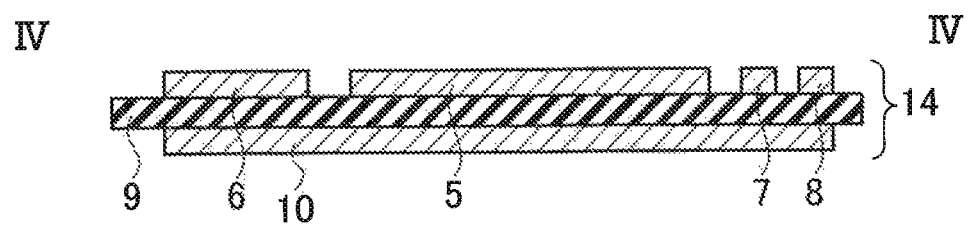
FIG. 5B is a schematic cross-sectional structure diagram taken in the line IV-IV of FIG. 5A.

FIG. 5A shows a schematic planar pattern configuration for explaining one process of a fabrication method for the power module 100 according to the first embodiment (Phase 1). Moreover, FIG. 5B shows a schematic cross-sectional structure taken in the line IV-IV of FIG. 5A.

Figure 6A:
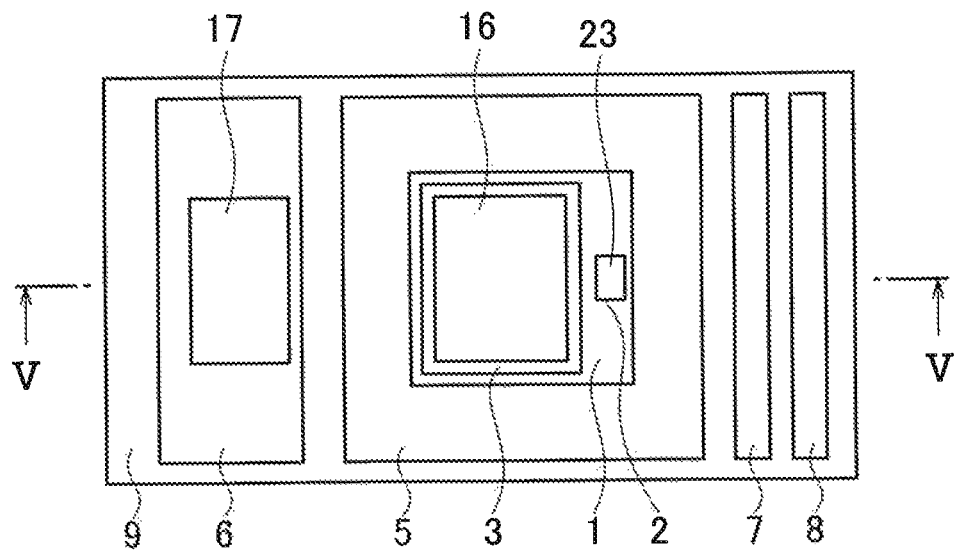
FIG. 6A is a schematic planar pattern configuration diagram for explaining one process of the fabrication method for the power module according to the first embodiment (Phase 2).
Figure 6B:
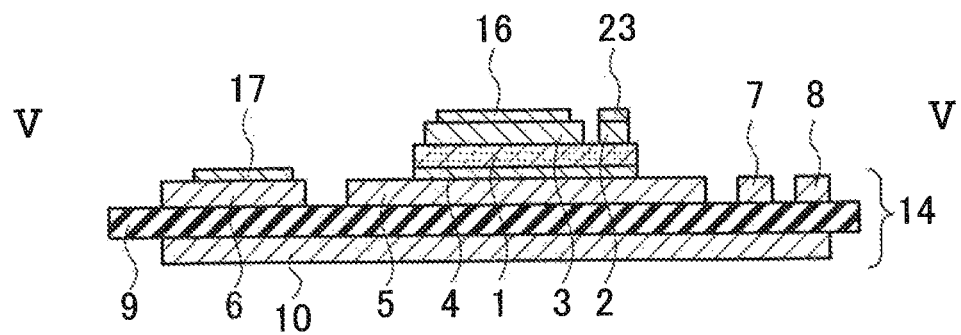
FIG. 6B is a schematic cross-sectional structure diagram taken in the line V-V of FIG. 6A.

Moreover, FIG. 6A shows a schematic planar pattern configuration for explaining one process of the fabrication method for the power module 100 according to the first embodiment (Phase 2). Moreover, FIG. 6B shows a schematic cross-sectional structure taken in the line V-V of FIG. 6A.

Figure 7:
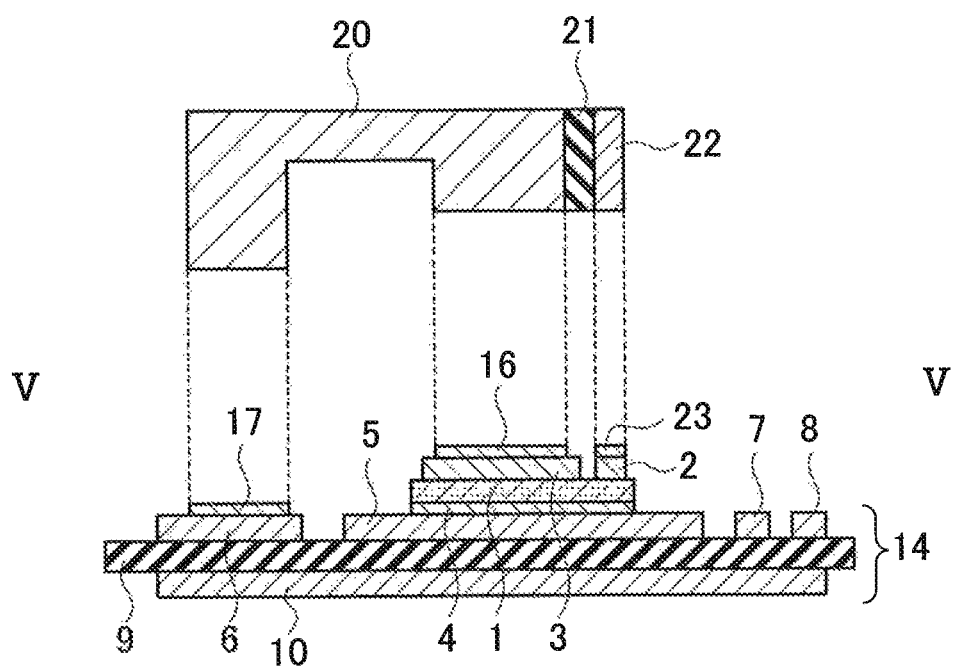
FIG. 7 is a schematic cross-sectional structure diagram for explaining one process of the fabrication method for the power module according to the first embodiment (Phase 3).

Furthermore, FIG. 7 shows a schematic cross-sectional structure for explaining one process of the fabrication method for the power module 100 according to the first embodiment (Phase 3).

Figure 8A:
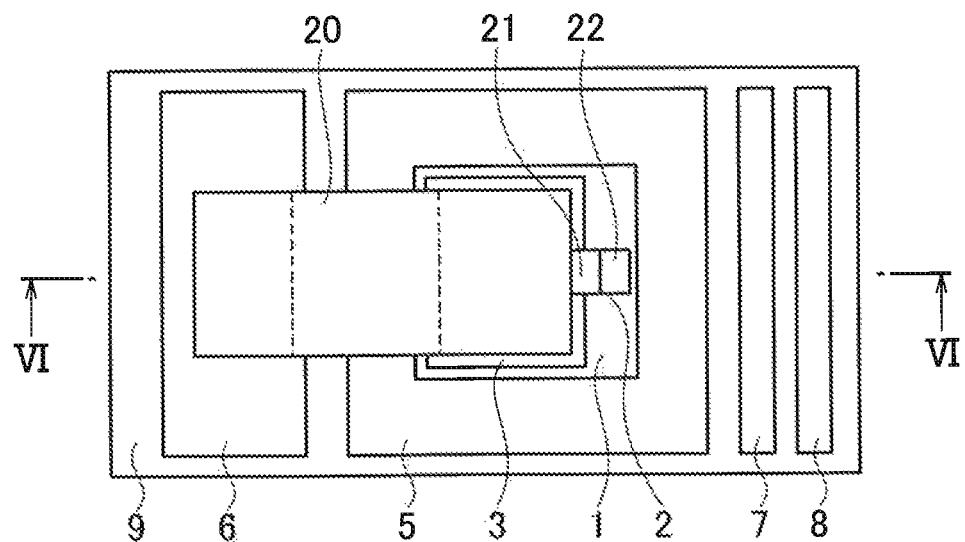
FIG. 8A is a schematic planar pattern configuration diagram for explaining one process of the fabrication method for the power module according to the first embodiment (Phase 4).
Figure 8B:
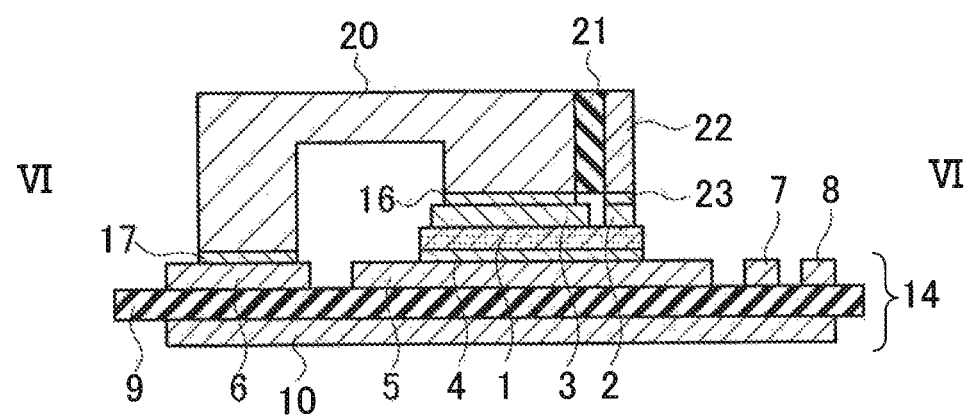
FIG. 8B is a schematic cross-sectional structure diagram taken in the line VI-VI of FIG. 8A.

Furthermore, FIG. 8A shows a schematic planar pattern configuration for explaining one process of the fabrication method for the power module 100 according to the first embodiment (Phase 4). Moreover, FIG. 8B shows a schematic cross-sectional structure taken in the line VI-VI of FIG. 8A.

(a) Firstly, as shown in FIGS. 5A and 5B, an insulating substrate 14 is prepared, and a copper foil at a front surface side of a ceramics substrate 9 is patterned. As a result of the patterning process, as shown in FIGS. 5A and 5B, a drain electrode pattern 5, a source electrode pattern 6, a source signal electrode pattern 7, and a gate signal electrode pattern 8 are formed on the ceramics substrate 9. In this case, as the insulating substrate 14, a Direct Bonding Copper (DBC) substrate, a Direct Brazed Aluminum (DBA) substrate or an Active Metal Brazed (Active Metal Bond) (AMB) substrate etc. are applicable, for example. In addition, an organic insulating resin layer may be applied as the insulation layer substrate, instead of the DBC substrate.

(b) Next, as shown in FIGS. 6A and 6B, a semiconductor device 1 is formed by a process of soldering on the insulating substrate 14. More specifically, a back surface electrode (drain electrode) of the semiconductor device 1 is electrically connected onto the drain electrode pattern 5 via a soldering layer 4 under chip.

(c) Next, as shown in FIGS. 6A and 6B, since a source pad electrode 3 and a gate pad electrode 2 are disposed on the front surface side of the semiconductor device, a soldering layer 16 on chip and a soldering layer 23 on gate pad electrode are formed 1 with respect to the source pad electrode 3 and the gate pad electrode 2. Similarly, a soldering layer 17 on source electrode pattern is formed on the source electrode pattern 6.

(d) Next, as shown in FIG. 7, by a process of assembling, a divided leadframe 20 for source and a divided leadframe 22 for gate pad electrode are connected to each other via an insulating portion (dividing portion) 21, and thereby a divided leadframe structure (20, 21, 22) is formed.

(e) Further, as shown in FIG. 7, the divided leadframe structure (20, 21, 22) is aligned on the insulating substrate 14 which mounts the semiconductor device 1 on a front surface side thereof.

(f) Next, as shown in FIGS. 8A and 8B, the divided leadframe 20 for source, and the source electrode pattern 6 and source pad electrode 3 are electrically connected to each other by a process of soldering via the soldering layer 17 on source electrode pattern and the soldering layer 16 on chip. Simultaneously, the divided leadframe 22 for gate pad electrode and the gate pad electrodes 2 are electrically connected to each other via the soldering layer 23 on gate pad electrode.

(g) Next, as shown in FIGS. 4A and 4B, the divided leadframe 22 for gate pad electrode and the gate signal electrode pattern 8 are connected to each other with the gate signal bonding wire 13. Moreover, the divided leadframe 20 for source and the source signal electrode pattern 7 is connected to each other with the source signal bonding wire 12.

(Shortening and Enhancing Efficiency of Fabricating Process)

In the above-mentioned fabricating process, the soldering layer 17 on source electrode pattern and the soldering layer 16 on chip may be previously formed at the divided leadframe 20 for source side. Similarly, the soldering layer 23 on gate pad electrode may be formed at the divided leadframe 22 for gate pad electrode side. In this case, the process of forming the soldering layer 16 on chip and the soldering layer 23 on gate pad electrode respectively on the source pad electrode 3 and the gate pad electrode 2, and the process of forming the soldering layer 17 on source electrode pattern on the source electrode pattern 6 can be omitted.

Moreover, the process of electrically connecting the semiconductor device 1 by the process of soldering onto the insulating substrate 14 and the process of electrically connecting the divided leadframe structure (20, 21, 22) by the process of soldering onto the insulating substrate 14 may be simultaneously implemented.

(a1) Firstly, as shown in FIGS. 5A and 5B, the insulating substrate 14 is prepared, and the copper foil at the front surface side of a ceramics substrate 9 is patterned.

(b1) Next, as shown in an upper portion of FIG. 7, by the process of assembling, the divided leadframe 20 for source and the divided leadframe 22 for gate pad electrode are connected to each other via the insulating portion (dividing portion) 21, and thereby a divided leadframe structure (20, 21, 22) is formed.

(c1) Next, as shown in FIGS. 8A and 8B, the semiconductor device 1 is electrically connected by the process of soldering on the drain electrode pattern 5 via the soldering layer 4 under chip. Simultaneously, the divided leadframe 20 for source, and the source electrode pattern 6 and source pad electrode 3 are electrically connected to each other via the soldering layer 17 on source electrode pattern and the soldering layer 16 on chip. Simultaneously, the divided leadframe 22 for gate pad electrode and the gate pad electrodes 2 are electrically connected to each other via the soldering layer 23 on gate pad electrode.

(d1) Next, as shown in FIGS. 4A and 4B, the divided leadframe 22 for gate pad electrode and the gate signal electrode pattern 8 are connected to each other with the gate signal bonding wire 13. Moreover, the divided leadframe 20 for source and the source signal electrode pattern 7 is connected to each other with the source signal bonding wire 12.

The semiconductor device 1 and the divided leadframe structure (20, 21, 22) may be simultaneously bonded to the insulating substrate 14 by the process of soldering. Thus, they may be bonded thereto by one process of soldering. After connecting the semiconductor device 1 to the insulating substrate 14 by the process of soldering, the divided leadframe structure (20, 21, 22) may be connected to the insulating substrate 14 by the process of soldering. Thus, they may be bonded thereto by divisionally two processes of soldering.

After such soldering processes, the source signal bonding wire 12 and the gate signal bonding wire 13 are electrically connected respectively to the source signal electrode pattern 7 and the gate signal electrode pattern 8 with aluminum wires.

As the above-mentioned processes, the process order ((soldering=>wire bonding) or (soldering=>soldering=>wire bonding)) according to the fabrication method for the power module 100 according to the first embodiment can be realized instead of the process order (soldering=>wire bonding=>soldering) according to the comparative example 2, and thereby shortening of and enhancing efficiency of the fabrication processes can be realized.

(Modified Example)

Figure 9:
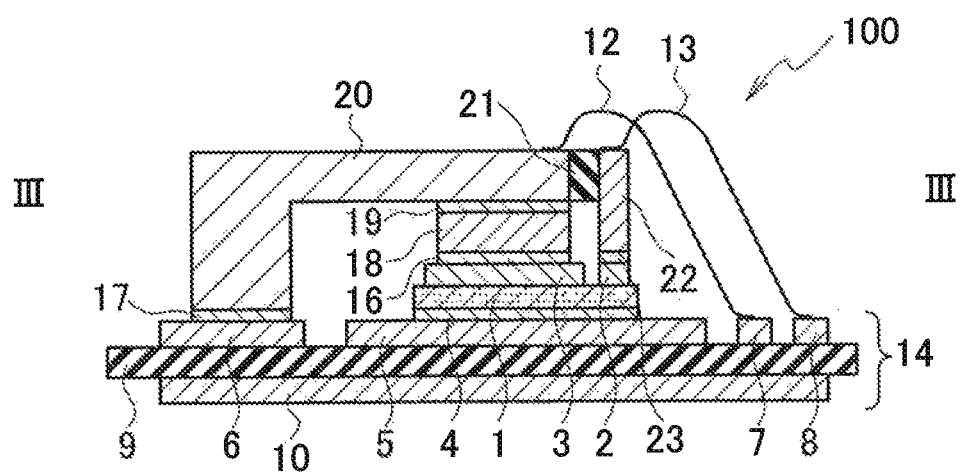
FIG. 9 is a schematic cross-sectional structure diagram taken in the line III-III of FIG. 4A, which shows a power module according to a modified example of the first embodiment.

FIG. 9 is a schematic cross-sectional structure taken in the line III-III of FIG. 4A, which shows a power module 100 according to a modified example of the first embodiment.

As shown in FIG. 9, the power module 100 according to the modified example of the first embodiment includes: a soldering layer 16 on chip disposed on the source pad electrode 3; a stress relaxation layer 18 disposed on the soldering layer 16 on chip, the stress relaxation layer 18 configured to relax a stress applied to the soldering layer 16 on chip; and a soldering layer 19 on stress relaxation layer disposed on the stress relaxation layer 18, wherein the divided leadframe 20 for source is connected to the source pad electrode 3 via the stress relaxation layer 18.

In the power module 100 according to the modified example of the first embodiment, the stress to the soldering layer 16 on chip produced in accordance with a coefficient of thermal expansion (CTE) difference between the divided leadframe 20 for source and the semiconductor device 1 can be relaxed.

As materials of the stress relaxation layer 18, metals having low CTE, e.g. CuMo, CuW, Mo, and W, can be used. Alternatively, Cu, Al, covar, invar, etc. are also applicable.

In the power module 100 according to the first embodiment, the divided leadframe structure (20, 21, 22) is connectable to both of the source pad electrode 3 and the gate pad electrode 2 by forming the leadframe having divided structure.

The fabrication method for the power module 100 according to the first embodiment includes: soldering the semiconductor device 1 on the insulating substrate 14, while soldering the leadframes 20, 22 to the semiconductor device 1; and connecting the source signal bonding wire 12 and the gate signal bonding wire 13 thereon. Accordingly, in the fabrication method for the power module 100 according to the first embodiment, the semiconductor device 1 and the leadframes 20, 22 can be soldered at once on the insulating substrate 14, and thereby the fabricating process can be simplified, and a fabricating cost can be reduced.

According to the first embodiment and its modified example, there can be provided the power module having the simplified structure, fabricated through the simplified process, and capable of conducting the large current; and the fabrication method for such a power module.

[Second Embodiment]

Figure 10:
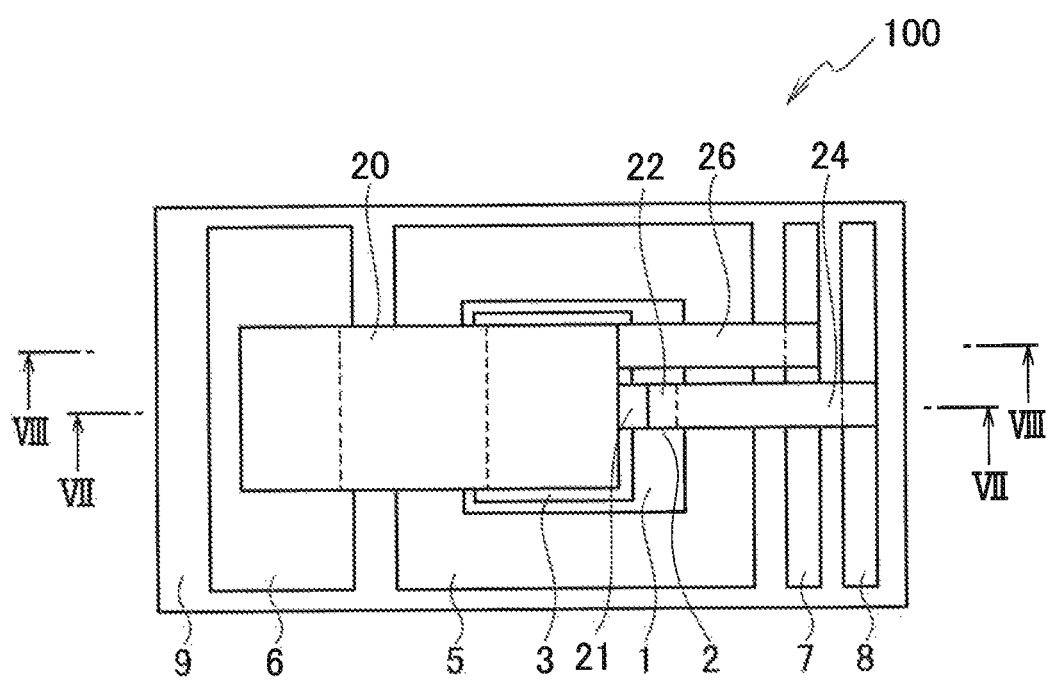
FIG. 10 is a schematic planar pattern configuration diagram showing a principal portion of a power module according to a second embodiment.

FIG. 10 shows a schematic planar pattern configuration of a principal portion of a power module 100 according to a second embodiment. Moreover, FIG. 11 shows a schematic cross-sectional structure taken in the line VII-VII of FIG. 10, and FIG. 12 shows a schematic cross-sectional structure taken in the line VIII-VIII of FIG. 10.

Figure 11:
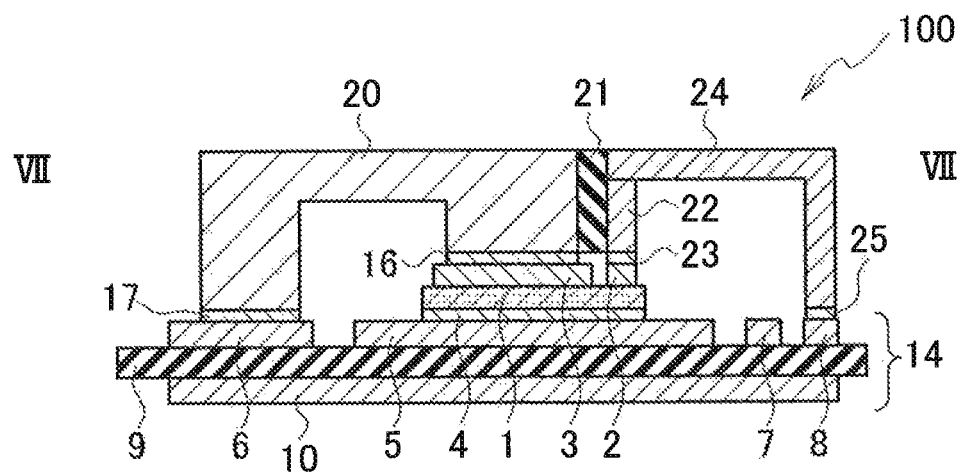
FIG. 11 is a schematic cross-sectional structure diagram taken in the line VII-VII of FIG. 10.
Figure 12:
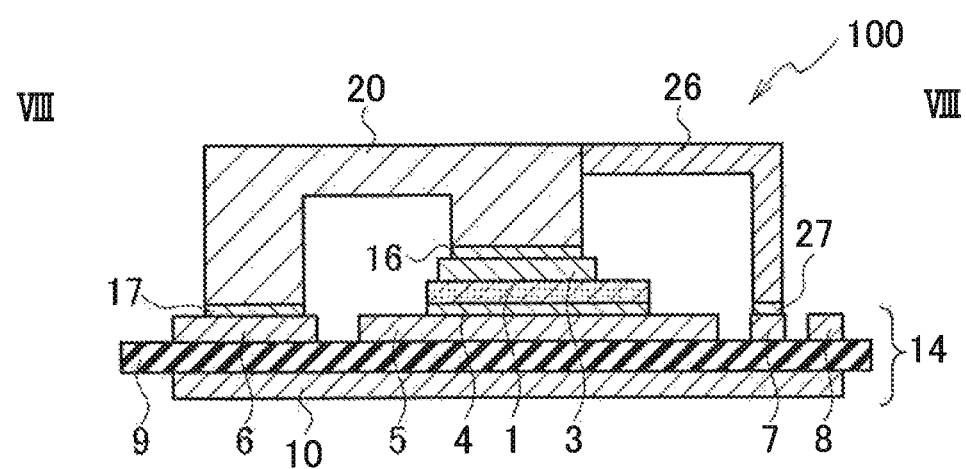
FIG. 12 is a schematic cross-sectional structure diagram taken in the line VIII-VIII of FIG. 10.

As shown in FIGS. 10-12, the power module 100 according to the second embodiment includes: a divided leadframe 26 for source signal electrically connected to a divided leadframe 20 for source, the divided leadframe 26 for source signal disposed on a source signal electrode pattern 7; and a divided leadframe 24 for gate electrically connected to a divided leadframe 22 for gate pad electrode, the divided leadframe 24 for gate disposed on the gate signal electrode pattern 8.

The divided leadframe 24 for gate is bonded to the gate signal electrode pattern 8 via a soldering layer 25 under divided leadframe for gate.

The divided leadframe 26 for source signal is bonded to the source signal electrode pattern 7 via a soldering layer 27 under divided leadframe for source signal.

In addition, a material of the divided leadframe 26 for source signal and a material of the divided leadframe 20 for source may be the same.

Moreover, a material of the divided leadframe 24 for gate and a material of the divided leadframe 22 for gate pad electrode may be the same.

Other configurations and composite materials are the same as those of the first embodiment.

As shown in FIGS. 10 and 11, in the power module 100 according to the second embodiment, the divided leadframe 22 for gate pad electrode is extended so as to be integrally connected to the divided leadframe 24 for gate functioned also as a gate signal line.

Similarly, as shown in FIGS. 10 and 12, in the power module 100 according to the second embodiment, the divided leadframe 20 for source is extended so as to be integrally connected to the divided leadframe 26 for source signal functioned also as a source sense signal line.

In the power module 100 according to the second embodiment, the source signal bonding wire and the gate signal bonding wire can be eliminated by adopting such a divided leadframe structure (20, 22, 26, 24).

(Fabrication Method)

Figure 13:
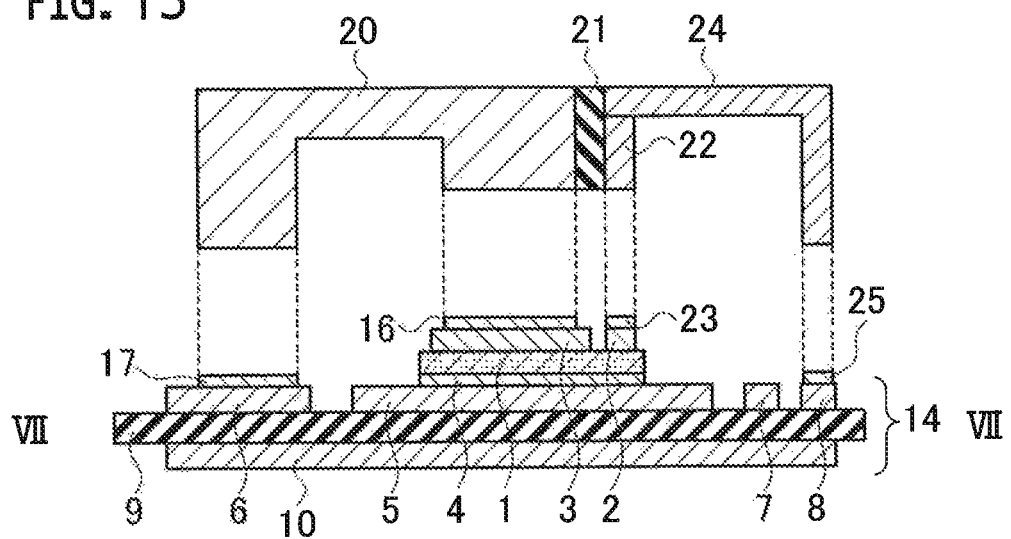
FIG. 13 is a schematic cross-sectional structure diagram for explaining one process of a fabrication method for the power module according to the second embodiment.
Figure 14:
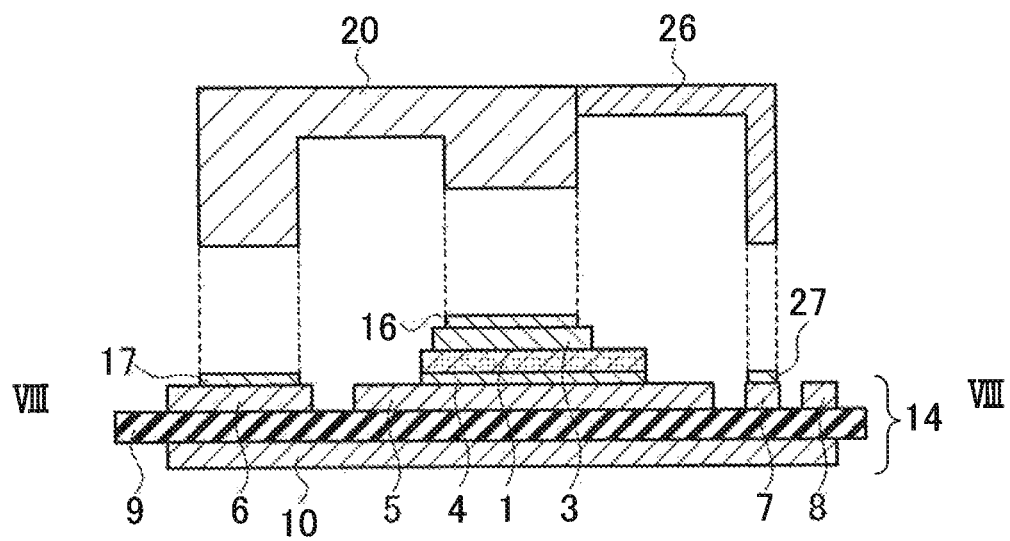
FIG. 14 is a schematic cross-sectional structure diagram for explaining one process of the fabrication method for the power module according to the second embodiment.

A schematic cross-sectional structure for explaining one process of the fabrication method for the power module according to the second embodiment is expressed as shown in FIGS. 13 and 14.

(a) Firstly, as shown in FIGS. 5A and 5B, an insulating substrate 14 is prepared, and a copper foil at a front surface side of a ceramics substrate 9 is patterned. As a result of the patterning process, as shown in FIGS. 5A and 5B, a drain electrode pattern 5, a source electrode pattern 6, a source signal electrode pattern 7, and a gate signal electrode pattern 8 are formed on the ceramics substrate 9. In this case, as the insulating substrate 14, a DBC substrate, a DBA substrate, or an AMB substrate is applicable, for example. In addition, an organic insulating resin layer may be applied as the insulation layer substrate, instead of the DBC substrate.

(b) Next, as shown in FIGS. 6A and 6B, a semiconductor device 1 is formed by a process of soldering on the insulating substrate 14. More specifically, a back surface electrode (drain electrode) of the semiconductor device 1 is electrically connected onto the drain electrode pattern 5 via a soldering layer 4 under chip.

(c) Next, since a source pad electrode 3 and a gate pad electrode 2 are disposed on the front surface side of the semiconductor device, a soldering layer 16 on chip and a soldering layer 23 on gate pad electrode are formed 1 with respect to the source pad electrode 3 and the gate pad electrode 2. Similarly, a soldering layer 17 on source electrode pattern is formed on the source electrode pattern 6.

(d) Next, as shown in upper portions of FIGS. 13 and 14, by the process of assembling, the divided leadframe 20 for source and the divided leadframe 22 for gate pad electrode are connected to each other via the insulating portion (dividing portion) 21, the divided leadframe 20 for source and the divided leadframe 26 for source signal are integrally connected to each other, and the divided leadframe 22 for gate pad electrode and the divided leadframe 24 for gate are integrally connected to each other, and thereby the divided leadframe structure (20, 21, 22, 24, 26) is formed.

(e) Further, as shown in FIGS. 13 and 14, the divided leadframe structure (20, 21, 22, 24, 26) is aligned on the insulating substrate 14 which mounts the semiconductor device 1 on a front surface side thereof.

(f) Next, as shown in FIGS. 10-12, the divided leadframe 20 for source, and the source electrode pattern 6 and source pad electrode 3 are electrically connected to each other by a process of soldering via the soldering layer 17 on source electrode pattern and the soldering layer 16 on chip. Simultaneously, the divided leadframe 22 for gate pad electrode and the gate pad electrodes 2 are electrically connected to each other via the soldering layer 23 on gate pad electrode. Simultaneously, the gate signal electrode pattern 8 and the divided leadframe 24 for gate are electrically connected to each other via the soldering layer 25 under divided leadframe for gate, and the source signal electrode pattern 7 and the divided leadframe 26 for source signal are electrically connected to each other via the soldering layer 27 under divided leadframe for source signal.

(Shortening and Enhancing Efficiency of Fabricating Process)

In the above-mentioned fabricating process, the soldering layer 17 on source electrode pattern and the soldering layer 16 on chip may be previously formed at the divided leadframe 20 for source side. Similarly, the soldering layer 23 on gate pad electrode may be previously formed at the divided leadframe 22 for gate pad electrode side. Similarly, the soldering layer 25 under divided leadframe for gate may be previously formed at the divided leadframe 24 for gate side. Similarly, the soldering layer 27 under divided leadframe for source signal may be previously formed at the divided leadframe 26 for source signal side. In this case, there can be omitted the process of forming the soldering layer 16 on chip and the soldering layer 23 on gate pad electrode respectively with respect to the source pad electrode 3 and the gate pad electrode 2, and the process of forming the soldering layer 17 on source electrode pattern on the source electrode pattern 6, and the process of forming the soldering layer 27 under divided leadframe for source signal and the soldering layer 25 under divided leadframe for gate respectively on the source signal electrode pattern 7 and the gate signal electrode pattern 8.

Moreover, the process of bonding the semiconductor device 1 by the process of soldering onto the insulating substrate 14 and the process of electrically connecting the divided leadframe structure (20, 21, 22, 24, 26) by the process of soldering onto the insulating substrate 14 may be simultaneously implemented.

(a1) Firstly, as shown in FIGS. 5A and 5B, the insulating substrate 14 is prepared, and the copper foil at the front surface side of a ceramics substrate 9 is patterned.

(b1) Next, as shown in upper portions of FIGS. 13 and 14, by the process of assembling, the divided leadframe 20 for source and the divided leadframe 22 for gate pad electrode and divided leadframe 24 for gate are connected to each other via the insulating portion (dividing portion) 21, the divided leadframe 20 for source and the divided leadframe 26 for source signal are integrally connected to each other, and the divided leadframe 22 for gate pad electrode and the divided leadframe 24 for gate are integrally connected to each other, and thereby the divided leadframe structure (20, 21, 22, 24, 26) is formed.

(c1) Next, as shown in FIGS. 13, 14, and 10-12, the semiconductor device 1 is connected by the process of soldering on the drain electrode pattern 5 via the soldering layer 4 under chip. Simultaneously, the divided leadframe 20 for source, and the source electrode pattern 6 and source pad electrode 3 are connected to each other via the soldering layer 17 on source electrode pattern and the soldering layer 16 on chip. Simultaneously, the divided leadframe 22 for gate pad electrode and the gate pad electrodes 2 are connected to each other via the soldering layer 23 on gate pad electrode. Simultaneously, the gate signal electrode pattern 8 and the divided leadframe 24 for gate are connected to each other via the soldering layer 25 under divided leadframe for gate, and the source signal electrode pattern 7 and the divided leadframe 26 for source signal are connected to each other via the soldering layer 27 under divided leadframe for source signal.

The semiconductor device 1 and the divided leadframe structure (20, 21, 22, 24, 26) may be simultaneously bonded to the insulating substrate 14 by the process of soldering. Thus, they may be bonded thereto by one process of soldering. After connecting the semiconductor device 1 to the insulating substrate 14 by soldering, the divided leadframe structure (20, 21, 22, 24, 26) may be connected to the insulating substrate 14 by soldering. Thus, they may be bonded thereto by divisionally two processes of soldering.

As the above-mentioned processes, the process order ((one process of soldering, i.e., simultaneously soldering) or (divisionally two processes of soldering, i.e., soldering =>soldering)) according to the fabrication method for the power module 100 according to the first embodiment can be realized instead of the process order (soldering=>wire bonding=>soldering) according to the comparative example 2, and thereby shortening of and enhancing efficiency of the fabrication processes can be realized.

In the fabrication method for the power module 100 according to the second embodiment, productivity enhancement can significantly be improved since the fabricating process is simplified, and thereby a fabricating cost can be reduced.

(Modified Examples)

Figure 15:
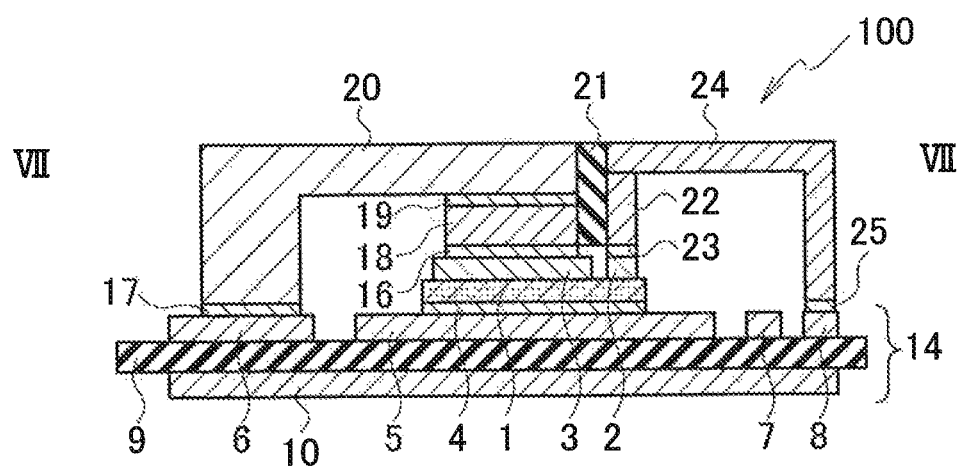
FIG. 15 is a schematic cross-sectional structure diagram taken in the line VII-VII of FIG. 10, which shows a power module according to a modified example of the second embodiment.
Figure 16:
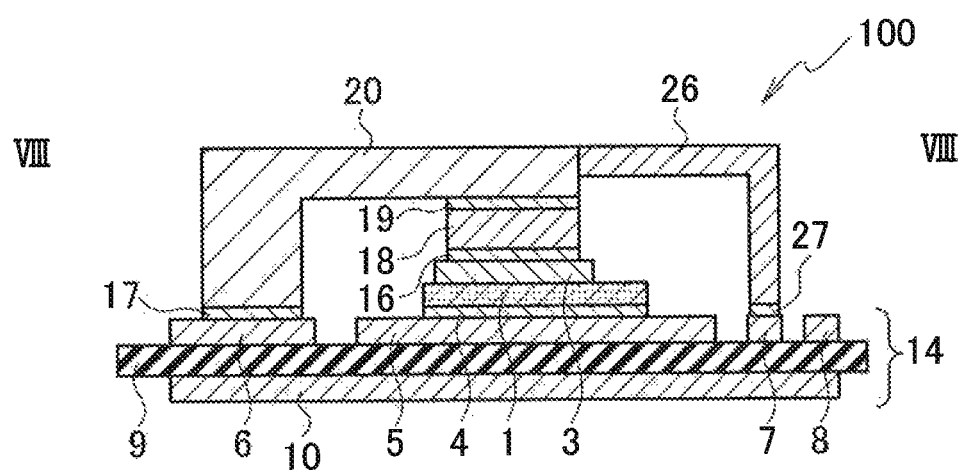
FIG. 16 is a schematic cross-sectional structure diagram taken in the line VIII-VIII of FIG. 10, which shows a power module according to a modified example of the second embodiment.

FIG. 15 is a schematic cross-sectional structure taken in the line VII-VII of FIG. 10, which shows a power module 100 according to a modified example of the second embodiment. FIG. 16 shows a schematic cross-sectional structure taken in the line VIII-VIII of FIG. 10.

As shown in FIGS. 15 and 16, the power module 100 according to the modified example of the second embodiment includes: a soldering layer 16 on chip disposed on the source pad electrode 3; a stress relaxation layer 18 disposed on the soldering layer 16 on chip, the stress relaxation layer 18 configured to relax a stress applied to the soldering layer 16 on chip; and a soldering layer 19 on stress relaxation layer disposed on the stress relaxation layer 18, wherein the divided leadframe 20 for source is connected to the source pad electrode 3 via the stress relaxation layer 18.

In the power module 100 according to the modified example of the second embodiment, the stress to the soldering layer 16 on chip produced in accordance with a coefficient of thermal expansion (CTE) difference between the divided leadframe 20 for source and the semiconductor device 1 can be relaxed.

As materials of the stress relaxation layer 18, metals having low CTE, e.g. CuMo, CuW, Mo, and W, can be used. Alternatively, Cu, Al, covar, invar, etc. are also applicable.

According to the second embodiment and its modified example, there can be provided the power module having the simplified structure, fabricated through the simplified process, and capable of conducting the large current; and the fabrication method for such a power module.

[Third Embodiment]

Figure 17:
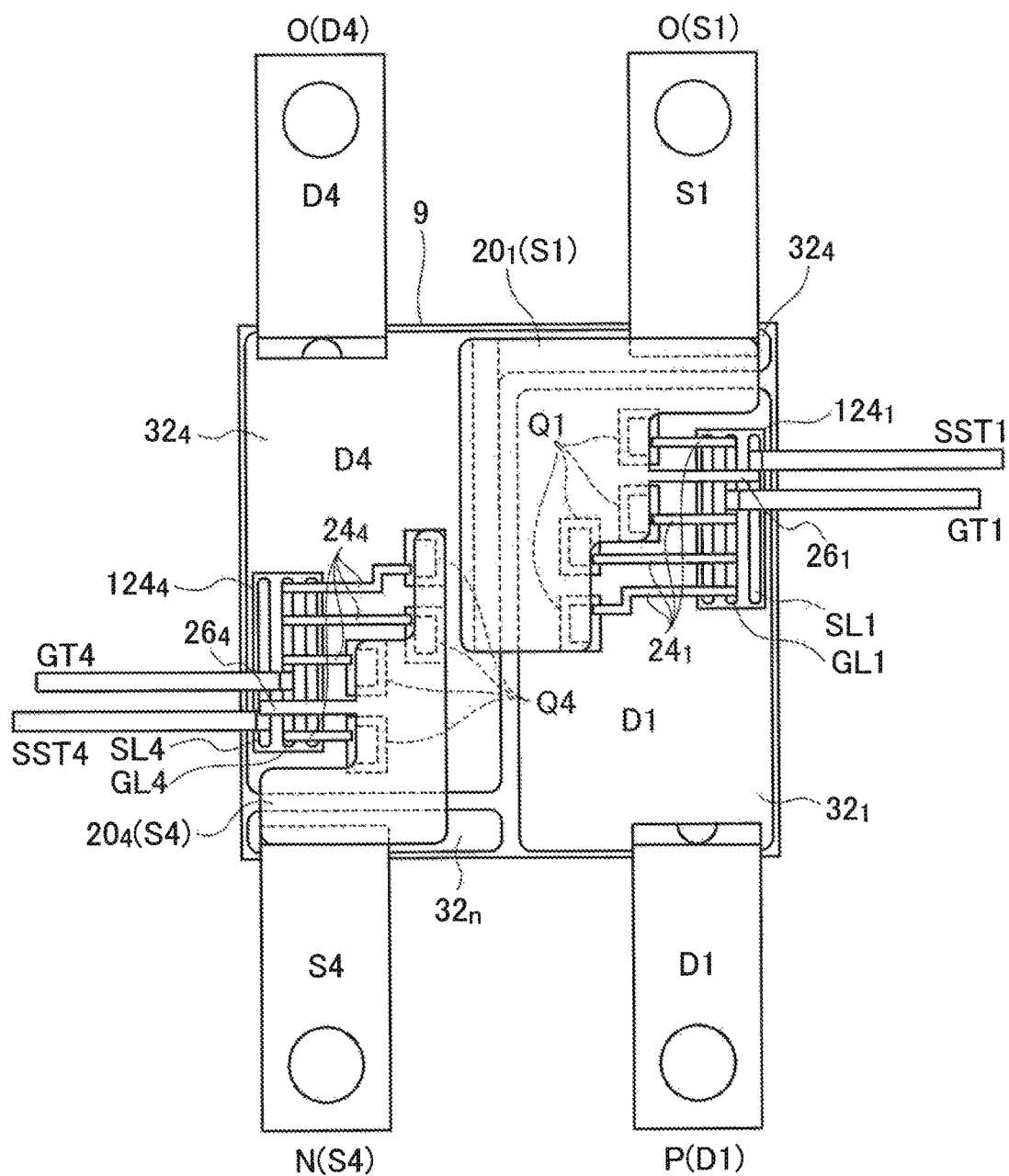
FIG. 17 is a schematic planar pattern configuration diagram before forming a resin layer in a 2-in-1 module (module with a built-in half-bridge), in a power module according to a third embodiment.
Figure 18:
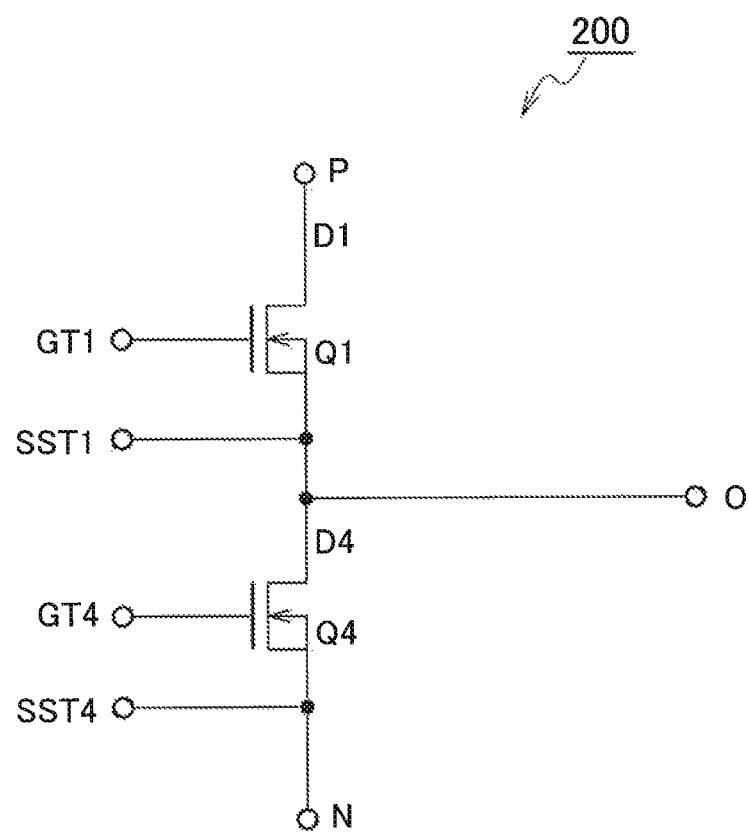
FIG. 18 is a circuit configuration diagram of the 2-in-1 module (module with the built-in half-bridge) in which an SiC Metal Oxide Semiconductor Field Effect Transistor (MISFET) is applied as a semiconductor device, in the power module according to the third embodiment.
Figure 19:
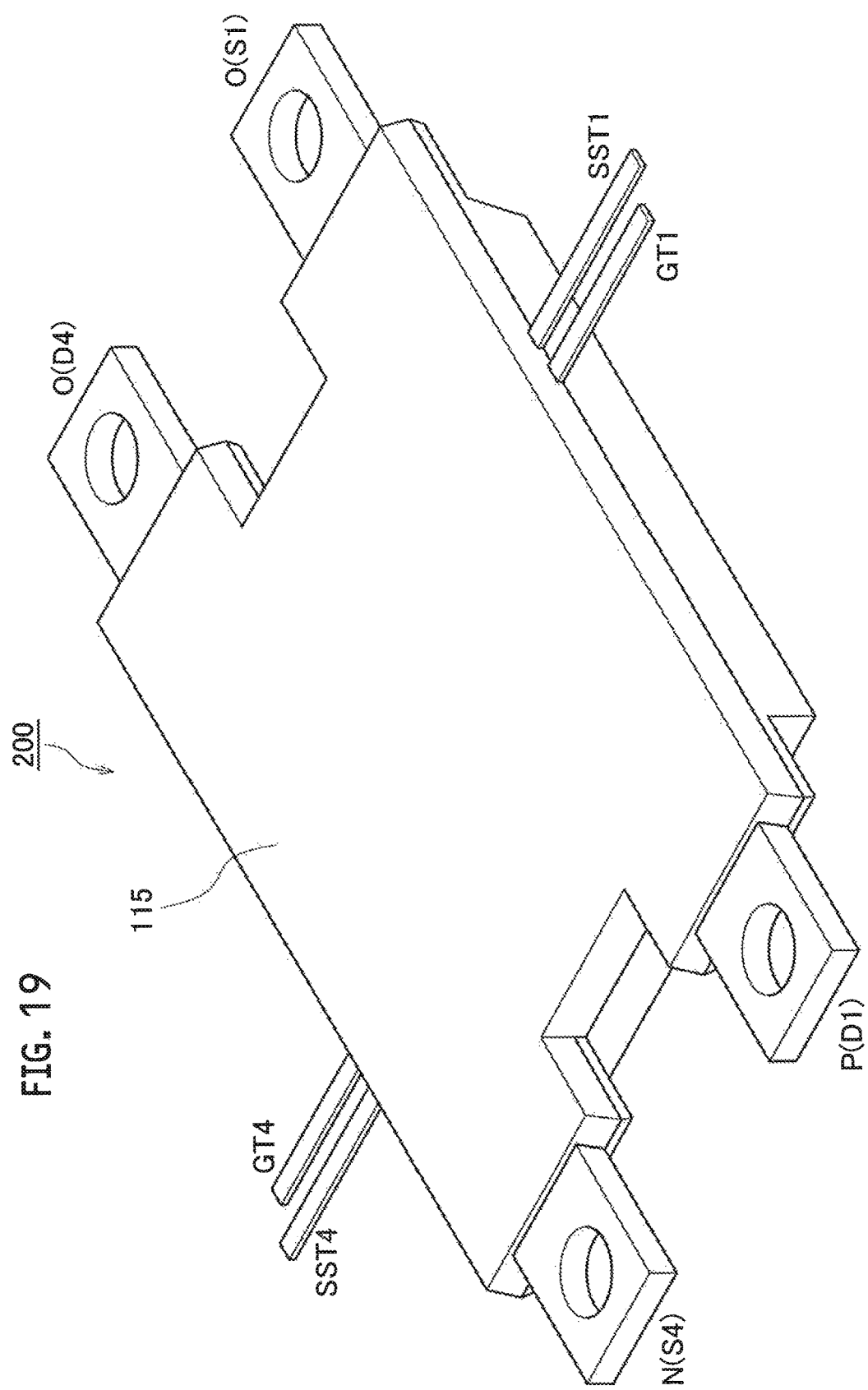
FIG. 19 is a schematic bird's-eye view configuration diagram after forming the resin layer in the module with the built-in half-bridge, in the power module according to the third embodiment.

FIG. 17 shows a schematic planar pattern configuration before forming a resin layer 115 in a 2-in-1 module (module with a built-in half-bridge), in a power module 200 according to a third embodiment, and FIG. 19 shows a schematic bird's-eye view configuration after forming the resin layer 115. Moreover, FIG. 18 shows a circuit configuration of the 2-in-1 module (module with the built-in half-bridge) corresponding to FIG. 17 to which SiC MISFET is applied as a semiconductor device, in the power module according to the third embodiment.

The power module 200 according to the third embodiment includes a configuration of a module with the built-in half-bridge in which two MISFETs Q1, Q4 are built in one module.

FIG. 17 shows an example of 4-chip of the MISFETs Q1 and 4-chip of the MISFETs Q4 respectively disposed in parallel.

As shown in FIG. 19, the power module 200 according to the third embodiment includes: a positive-side power terminal P and a negative-side power terminal N disposed at a first side of the ceramic substrate 9 covered with the resin layer 115; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In the present embodiment, as shown in FIG. 17, the gate terminal GT1 and the source sense terminal SST1 are connected to the gate signal electrode pattern GL1 and the source signal electrode pattern SL1 in the MISFET Q1; and the gate terminal GT4 and the source sense terminal SST4 are connected to the gate signal electrode pattern GL4 and the source signal electrode pattern SL4 in the MISFET Q4.

As shown in FIG. 17, divided leadframes $24_1$, $24_4$ for gate and leadframes $26_1$, $26_4$ for source signal are connected, from the MISFETs Q1, Q4 toward the gate signal electrode patterns GL1, GL4 and the source sense signal electrode patterns SL1, SL4 which are disposed on the signal substrates $124_1$, $124_4$. Moreover, gate terminals GT1, GT4 and SST1, SST4 for external extraction are connected to the gate signal electrode patterns GL1, GL4 and the source sense signal electrode patterns SL1, SL4 by soldering etc.

As shown in FIG. 17, the signal substrates $124_1$, $124_4$ are connected by soldering etc. on the ceramics substrate 9.

Although illustration is omitted in FIGS. 17-19, the diodes may be connected reversely in parallel respectively between D1 and S1 and between D4 and S4 of the MISFETs Q1, Q4.

In the example shown in FIGS. 17-19, the sources S1, S4 in 4 chips of the MISFETs Q1, Q4 disposed in parallel are commonly connected with the divided leadframes $20_1$ (S1), $20_4$ (S4) for source.

The positive-side power terminal P and the negative-side power terminal N, and the gate terminals GT1, GT4 and SST1, SST4 for external extraction can be formed by including Cu, for example.

The signal substrates $124_1$, $124_4$ can be formed by including a ceramics substrate. The ceramic substrate may be formed by including $Al_2O_3$, AlN, SiN, AlSiC, or SiC of which at least the surface is insulation, for example.

Main wiring conductors (electrode patterns) $32_1$, $32_4$, $32_n$ can be formed by including Cu, Al, etc., for example.

The divided leadframes $20_1$ (S1), $20_4$ (S4) for source connected to the sources S1, S4 of MISFETs Q1, Q4 may be formed by including Cu, CuMo, etc., for example. If comparing same-sized materials having the same value of CTE, a generated stress in material having a larger value of Young's modulus is larger than a generated stress in material having a smaller value of Young's modulus. Accordingly, if materials of which the value of Young's modulus×CTE is smaller is selected, structural members having a smaller value of the generated stress can be obtained. CuMo has such an advantage. Moreover, although CuMo is inferior to Cu, the electric resistivity of CuMo is also relatively low. Moreover, a separation distance along the front side surface between the divided leadframes $20_1$ (S1), $20_4$ (S4) for source is called a creepage distance. A value of the creepage distance thereof is approximately 2 mm, for example.

The divided leadframes $24_1$, $24_4$ for gate and the divided leadframes $26_1$, $26_4$ for source signal can be formed by including Al, AlCu, etc., for example.

SiC based power devices, e.g. SiC DIMISFET and SiC TMISFET, or GaN based power devices, e.g. GaN based High Electron Mobility Transistor (HEMT), are applicable as the MISFETs Q1, Q4. In some instances, power devices, e.g. Si based MISFETs and IGBT, are also applicable thereto.

In the power module 200 according to the third embodiment, 4 chips of the MISFETs Q1 are disposed on the main wiring conductor (electrode pattern) $32_1$ via the soldering layer 4 under chip. Similarly, 4 chips of the MISFETs Q4 are disposed on the main wiring conductor (electrode pattern) $32_4$ via the soldering layer 4 under chip.

More particularly, as shown in FIG. 17, a principal portion of the power module 200 according to the third embodiment includes: a ceramics substrate 9; a source electrode pattern $32n$, drain electrode patterns $32_1$, $32_4$, source signal electrode patterns SL1, SL4, and gate signal electrode patterns GL1, GL4 respectively disposed on the ceramics substrate 9; semiconductor devices Q1, Q4 respectively disposed on the drain electrode patterns $32_1$, $32_4$, the semiconductor devices Q1, Q4 respectively including a source pad electrode (3) and a gate pad electrode (2) at a front surface side; divided leadframes $20_1$ (S1), $20_4$ (S4) for source respectively bonded to the source electrode pattern $32_n$, the drain electrode pattern $32_4$, and the source pad electrode (3); and divided leadframes ($22_1$, $22_4$) for gate pad electrode respectively bonded to the gate pad electrode (2). Illustration of the divided leadframes ($22_1$, $22_4$) for gate pad electrode is omitted in FIG. 17 since the divided leadframes ($22_1$, $22_4$) for gate pad electrode are disposed under the divided leadframes $24_1$, $24_4$ for gate. Since the drain electrode pattern $32_4$ serves also as a source electrode of the semiconductor device Q1 while the drain electrode pattern $32_4$ is a drain electrode of the semiconductor device Q4, the drain electrode pattern $32_4$ is connected to the divided leadframe $20_1$ (S1) for source.

Furthermore, as shown in FIG. 17, the power module 200 according to the third embodiment includes: divided leadframes $26_1$, $26_4$ for source signal respectively and electrically connected to the divided leadframes $20_1$ (S1), $20_4$ (S4) for source, the divided leadframes $26_1$, $26_4$ for source signal respectively disposed on the source signal electrode patterns SL1, SL4; and divided leadframes $24_1$, $24_4$ for gate respectively and electrically connected with the divided leadframes ($22_1$, $22_4$) for gate pad electrode, the divided leadframes $24_1$, $24_4$ for gate respectively disposed on the gate signal electrode patterns GL1, GL4. In the same manner as that of FIG. 11 in the second embodiment, assembling connection of the divided leadframes $24_1$, $24_4$ for gate is performed via the insulating portion (dividing portion) (21) with respect to the divided leadframes $20_1$ (S1), $20_4$ (S4) for source. Illustration of the insulating portion (dividing portion) (21) is omitted in FIG. 17.

The divided leadframes $24_1$, $24_4$ for gate are respectively bonded to the gate signal electrode patterns GL1, GL4 via the soldering layer (25) under divided leadframe for gate.

The divided leadframes $26_1$, $26_4$ for source signal are respectively bonded to the source signal electrode patterns SL1, SL4 via the soldering layer (27) under divided leadframe for source signal.

In addition, a material of the divided leadframes $26_1$, $26_4$ for source signal and a material of the divided leadframes $20_1$ (S1), $20_4$ (S4) for source may be the same.

Moreover, a material of the divided leadframes $24_1$, $24_4$ for gate and a material of the divided leadframes ($22_1$, $22_4$) for gate pad electrode may be the same.

Other configurations and composite materials are the same as those of the second embodiment.

As shown in FIG. 17, also in the power module 200 according to the third embodiment, the divided leadframes ($22_1$, $22_4$) for gate pad electrode are respectively extended so as to be integrally connected to the divided leadframes $24_1$, $24_4$ for gate functioned also as gate signal lines.

Similarly, as shown in FIG. 17, also in the power module 200 according to the third embodiment, the divided leadframes $20_1$ (S1), $20_4$ (S4) for source are respectively extended so as to be integrally connected to the divided leadframes $26_1$, $26_4$ for source signal functioned also as source sense signal lines.

In the power module 200 according to the third embodiment, the source signal bonding wire and the gate signal bonding wire can be eliminated by adopting such a divided leadframe structure (($20_1$, $20_4$), ($26_1$, $26_4$), ($24_1$, $24_4$)).

Also in the power module 200 according to the third embodiment, the stress relaxation layer 18 may be disposed between the divided leadframes $20_1$ (S1), $20_4$ (S4) for source and the source pad electrode 3, as similarly to the modified example of the second embodiment (FIGS. 15 and 16).

Since the fabrication method for the power module 200 according to the third embodiment is the same as that of the second embodiment, detailed explanation is omitted.

According to the third embodiments, there can be provided the 2-in-1 module (module with the built-in half-bridge) as the power module having the simplified structure, fabricated through the simplified process, and capable of conducting the large current.

(Examples of Power Module)

Hereinafter, there will now be explained examples of the power module according to the embodiments. Needless to say, the divided leadframe structure is adopted also in the power module explained hereinafter.

Figure 20A:
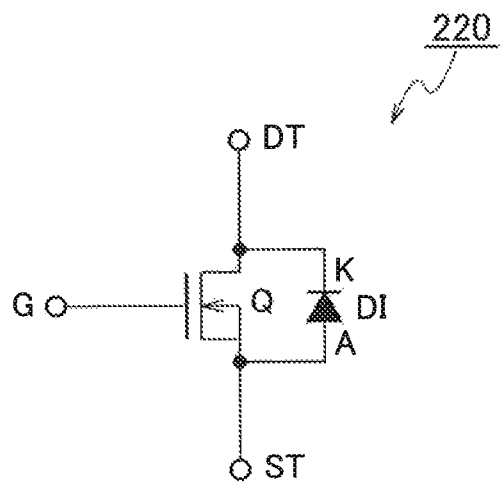
FIG. 20A is a schematic circuit representative diagram of the SiC MISFET of a 1-in-1 module, which is the power module according to the embodiments.
Figure 20B:
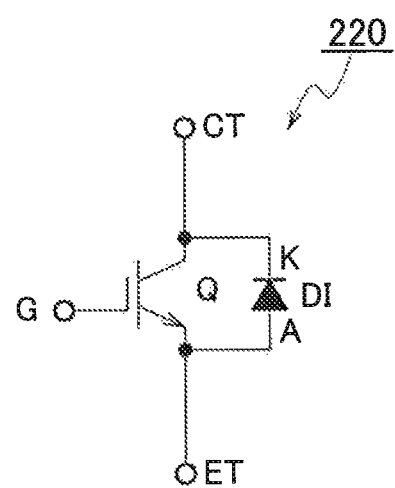
FIG. 20B is a schematic circuit representative diagram of an IGBT of the 1-in-1 module, which is the power module according to the embodiments.

FIG. 20A shows a schematic circuit representative of an SiC MISFET of the 1-in-1 module, which is the power module 220 according to the embodiments. FIG. 20B shows a schematic circuit representation of the IGBT of the 1-in-1 module.

A diode DI connected in reversely parallel to the MISFET Q is shown in FIG. 20A. A main electrode of the MISFET Q is expressed with a drain terminal DT and a source terminal ST. Similarly, a diode DI connected in reversely parallel to the IGBT Q is shown in FIG. 20B. A main electrode of the IGBT Q is expressed with a collector terminal CT and an emitter terminal ET.

Figure 21:
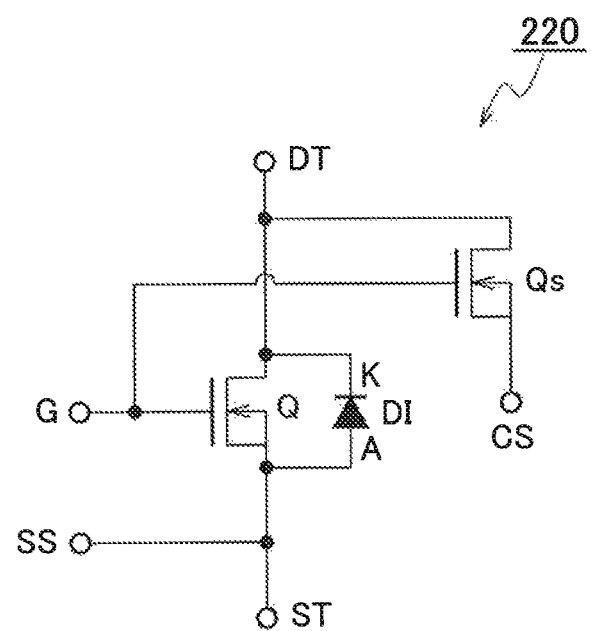
FIG. 21 is a detail circuit representative diagram of the SiC MISFET of the 1-in-1 module, which is the power module according to the embodiments.

Moreover, FIG. 21 shows a detailed circuit representative of the SiC MISFET of the 1-in-1 module, which is the power module 220 according to the embodiments.

The power module 220 according to the embodiments includes a configuration of 1-in-1 module, for example. More specifically, one piece of the MISFET Q is included in one module. As an example, five chips (MISFET×5) can be mounted thereon, and a maximum of five pieces of the MISFETs Q respectively can be connected to one another in parallel. Note that it is also possible to mount a part of five pieces of the chips for the diode DI thereon.

More particularly, as shown in FIG. 21, a sense MISFET Qs is connected to the MISFETQ in parallel. The sense MISFET Qs is formed as a minuteness transistor in the same chip as the MISFET Q. In FIG. 21, reference numeral SS denotes a source sense terminal, reference numeral CS denotes a current sense terminal, and reference numeral G denotes a gate signal terminal. Note that, also in the semiconductor chip Q according to the embodiments, the sense MISFET Qs is formed as a minuteness transistor in the same chip.

Figure 22A:
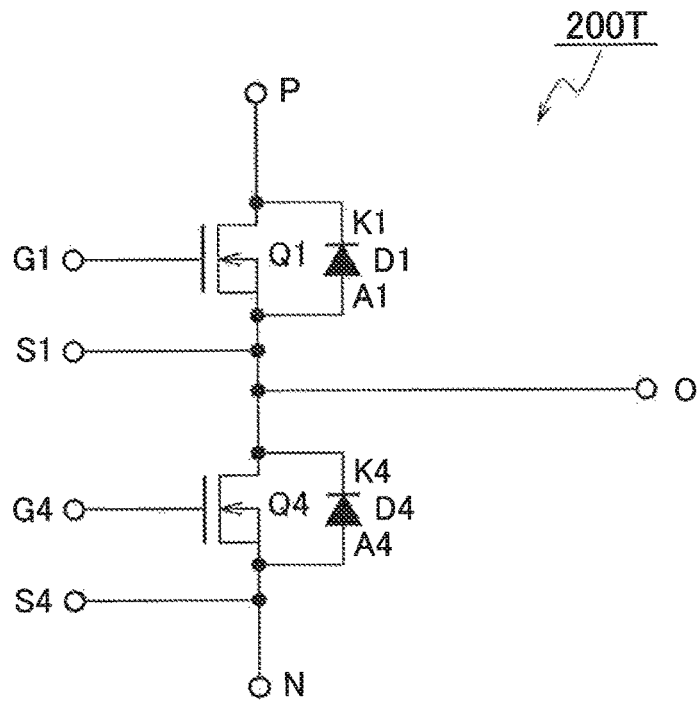
FIG. 22A is a schematic circuit representative diagram of the SiC MISFET of the 2-in-1 module, which is the power module according to the embodiments.

Moreover, FIG. 22A shows a schematic circuit representative of the SiC MISFET of the 1-in-1 module, which is the power module 200T according to the embodiments.

As shown in FIG. 22A, two MISFETs Q1, Q4, and diodes D1, D4 connected in reversely parallel to the MISFETs Q1, Q4 are built in one module. Reference numeral G1 denotes a gate signal terminal of the MISFET Q1, and reference numeral S1 denotes a source terminal of the MISFET Q1. Reference numeral G4 denotes a gate signal terminal of the MISFET Q4, and reference numeral S4 denotes a source terminal of the MISFET Q4. Reference numeral P denotes a positive side power input terminal, reference numeral N denotes a negative side power input terminal, and reference numeral O denotes an output terminal.

Figure 22B:
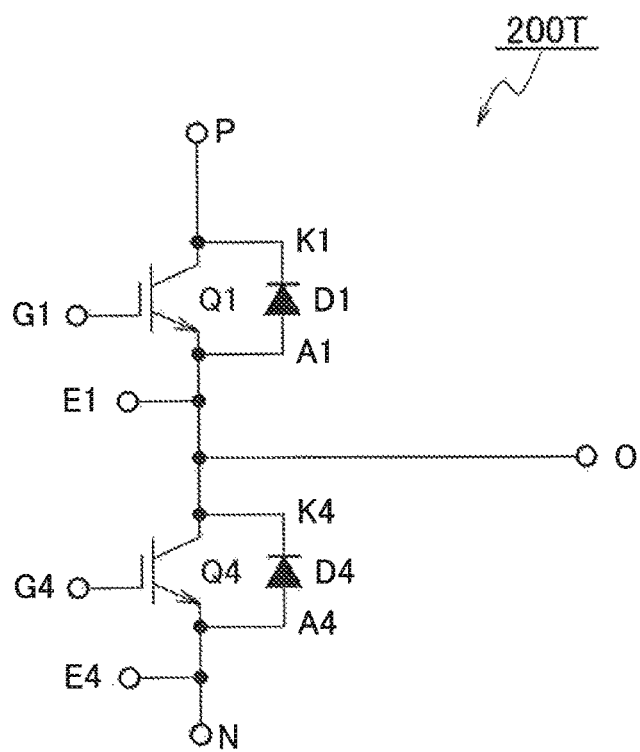
FIG. 22B is a schematic circuit representative diagram of the IGBT of the 2-in-1 module, which is the power module according to the embodiments.

Moreover, FIG. 22B shows a schematic circuit representative of the 2-in-1 module, which is the power module 200T according to the embodiments. As shown in FIG. 22B, two IGBTs Q1, Q4, and diodes D1, D4 connected in reversely parallel to the IGBTs Q1, Q4 are built in one module. Reference numeral G1 denotes a gate signal terminal of the IGBT Q1, and reference numeral E1 denotes an emitter terminal of the IGBT Q1. Reference numeral G4 denotes a gate signal terminal of the IGBT Q4, and reference numeral E4 denotes an emitter terminal of the IGBT Q4. Reference numeral P denotes a positive side power input terminal, reference numeral N denotes a negative side power input terminal, and reference numeral O denotes an output terminal.

(Configuration Example of Semiconductor Device)

FIG. 23A shows a schematic cross-sectional structure of an SiC MISFET, which is an example of a semiconductor device which can be applied to the power module according to the embodiments, and FIG. 23B shows a schematic cross-sectional structure of the IGBT.

As shown in FIG. 23A, a schematic cross-sectional structure of the SiC MISFET as an example of the semiconductor device 110 (Q) which can be applied to the power module according to the embodiments includes: a semiconductor substrate 126 composed by including an $n^-$ type high resistivity layer; a p body region 128 formed on a front surface side of the semiconductor substrate 126; a source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an $n^+$ drain region 124 disposed on a back side surface opposite to the surface of the semiconductor substrate 126; and a drain electrode 136 connected to the $n^+$ type drain area 124.

Although the semiconductor device 110 is composed by including a planar-gate-type n channel vertical SiC-MISFET in FIG. 23A, the semiconductor device 110 may be composed by including an n channel vertical SiC-TMISFET, etc., shown in FIG. 27 mentioned below.

Moreover, a GaN based FET etc. instead of SiC MISFET can also be adopted to the semiconductor device 110 (Q) which can be applied to the power module according to the Any one of an SiC based power device, a GaN based power device, or an AlN based power device can be adopted to the semiconductor device 110 applicable to the power module according to the embodiment.

Furthermore, a semiconductor of which the bandgap energy is from 1.1 eV to 8 eV, for example, can be used for the semiconductor device 110 applicable to the power module according to the embodiment.

Similarly, as shown in FIG. 23B, the IGBT as an example of the semiconductor device 110A (Q) applicable to the power module according to the embodiment includes: a semiconductor substrate 126 composed by including an $n^-$ type high resistivity layer; a p body region 128 formed on a front surface side of the semiconductor substrate 126; an emitter region 130E formed on a front side surface of the p body region 128; a gate insulating film 132 disposed on a front side surface of the semiconductor substrate 126 between the p body regions 128; a gate electrode 138 disposed on the gate insulating film 132; an emitter electrode 134E connected to the emitter region 130E and the p body region 128; a $p^+$ collector region 124P disposed on a back side surface opposite to the surface of the semiconductor substrate 126; and a collector electrode 136C connected to the $p^+$ collector region 124P.

In FIG. 23B, although the semiconductor device 110A is composed by including a planar-gate-type n channel vertical IGBT, the semiconductor device 110A may be composed by including a trench-gate-type n channel vertical IGBT, etc.

Figure 24:
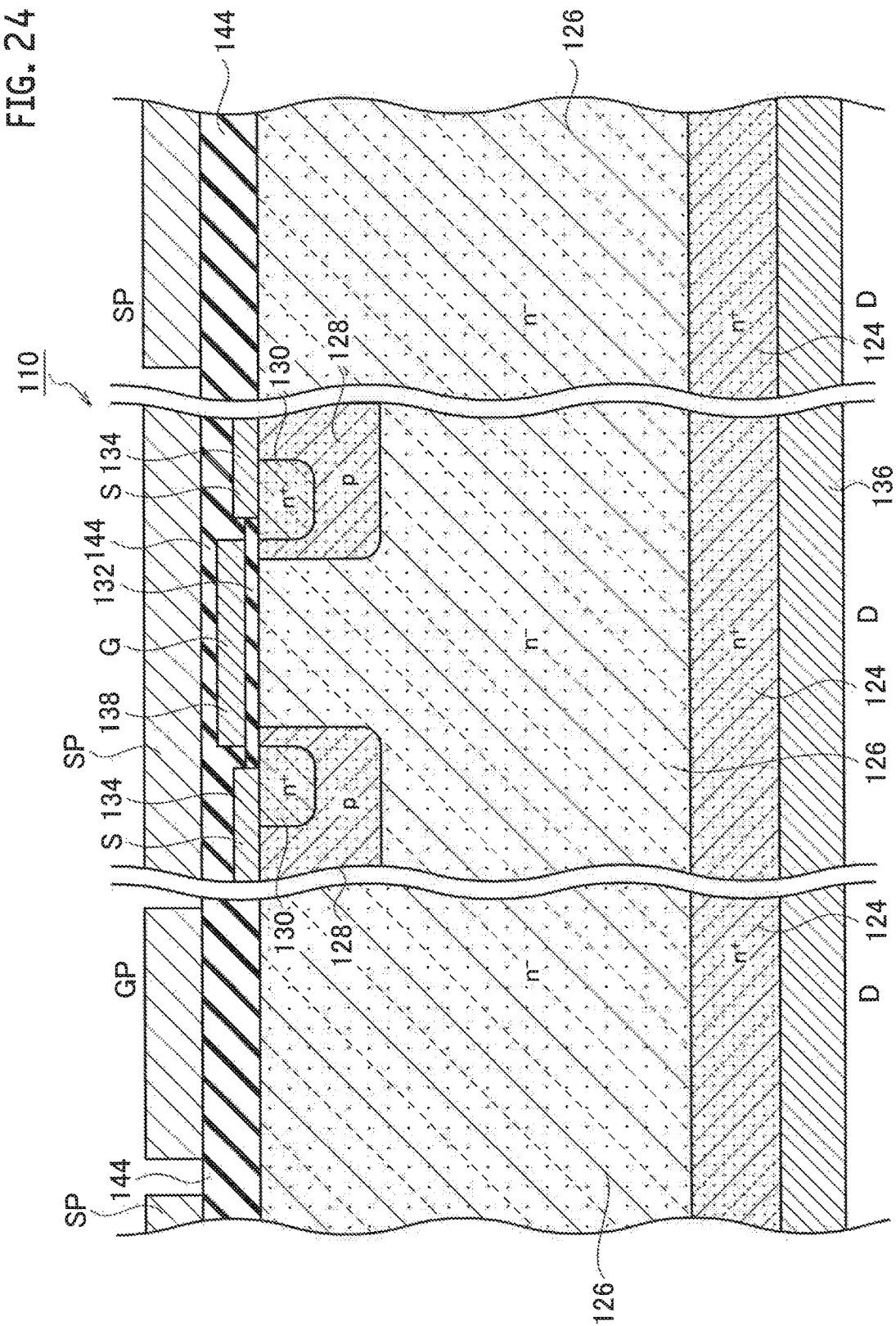
FIG. 24 is a schematic cross-sectional structure diagram showing an SiC MISFET including a source pad electrode SP and a gate pad electrode GP, which is an example of the semiconductor device to be applied to the power module according to the embodiments.

FIG. 24 shows a schematic cross-sectional structure of an SiC MISFET including a source pad electrode SP and a gate pad electrode GP, which is an example of the semiconductor device 110 applicable to the power module according to the embodiment. The gate pad electrode GP is connected to the gate electrode 138 disposed on the gate insulating film 132, and the source pad electrode SP is connected to the source electrode 134 connected to the source region 130 and the p body region 128.

Moreover, as shown in FIG. 24, the gate pad electrode GP and the source pad electrode SP are disposed on an interlayer insulating film 144 for passivation which covers the surface of the semiconductor device 110. Microstructural transistor structure may be formed in the semiconductor substrate 126 below the gate pad electrode GP and the source pad electrode SP in the same manner as the center portion shown in FIG. 23A or 24.

Furthermore, as shown in FIG. 24, the source pad electrode SP may be disposed to be extended onto the interlayer insulating film 144 for passivation, also in the transistor structure of the center portion.

Figure 25:
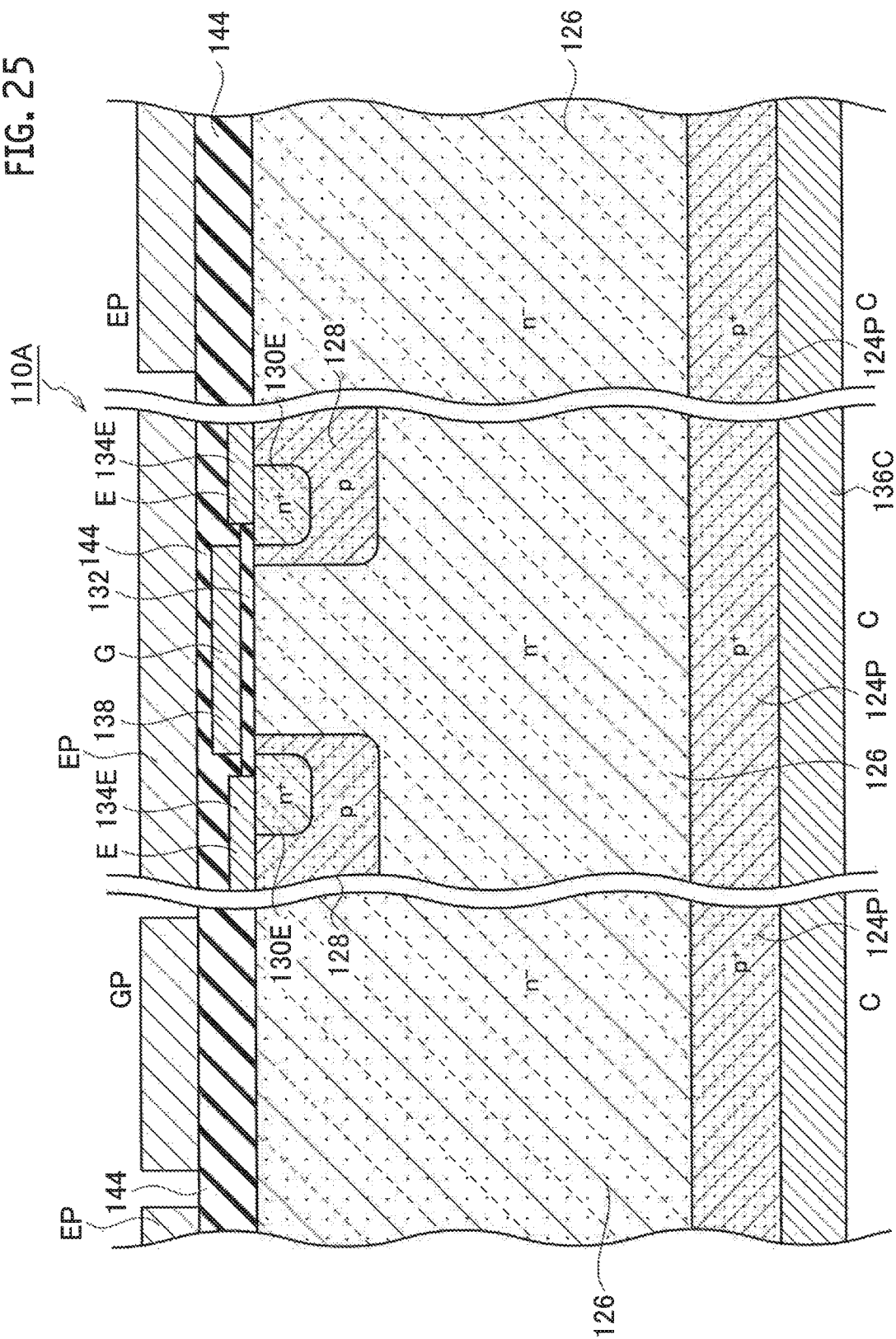
FIG. 25 is a schematic cross-sectional structure diagram of the IGBT including an emitter pad electrode EP and a gate pad electrode GP, which is an example of the semiconductor device to be applied to the power module according to the embodiments.

FIG. 25 shows a schematic cross-sectional structure of an IGBT including a source pad electrode SP and a gate pad electrode GP, which is an example of the semiconductor device 110A applied to the power modules 200, 200T according to the embodiment. The gate pad electrode GP is connected to the gate electrode 138 disposed on the gate insulating film 132, and the emitter pad electrode EP is connected to the emitter electrode 134E connected to the emitter region 130E and the p body region 128.

Moreover, as shown in FIG. 25, the gate pad electrode GP and the emitter pad electrode EP are disposed on an interlayer insulating film 144 for passivation which covers the surface of the semiconductor device 110A. Microstructural IGBT structure may be formed in the semiconductor substrate 126 below the gate pad electrode GP and the emitter pad electrode EP in the same manner as the center portion shown in FIG. 23B or 25.

Furthermore, as shown in FIG. 25, the emitter pad electrode EP may be disposed to be extended onto the interlayer insulating film 144 for passivation, also in the IGBT structure of the center portion.

—SiC DIMISFET—

Figure 26:
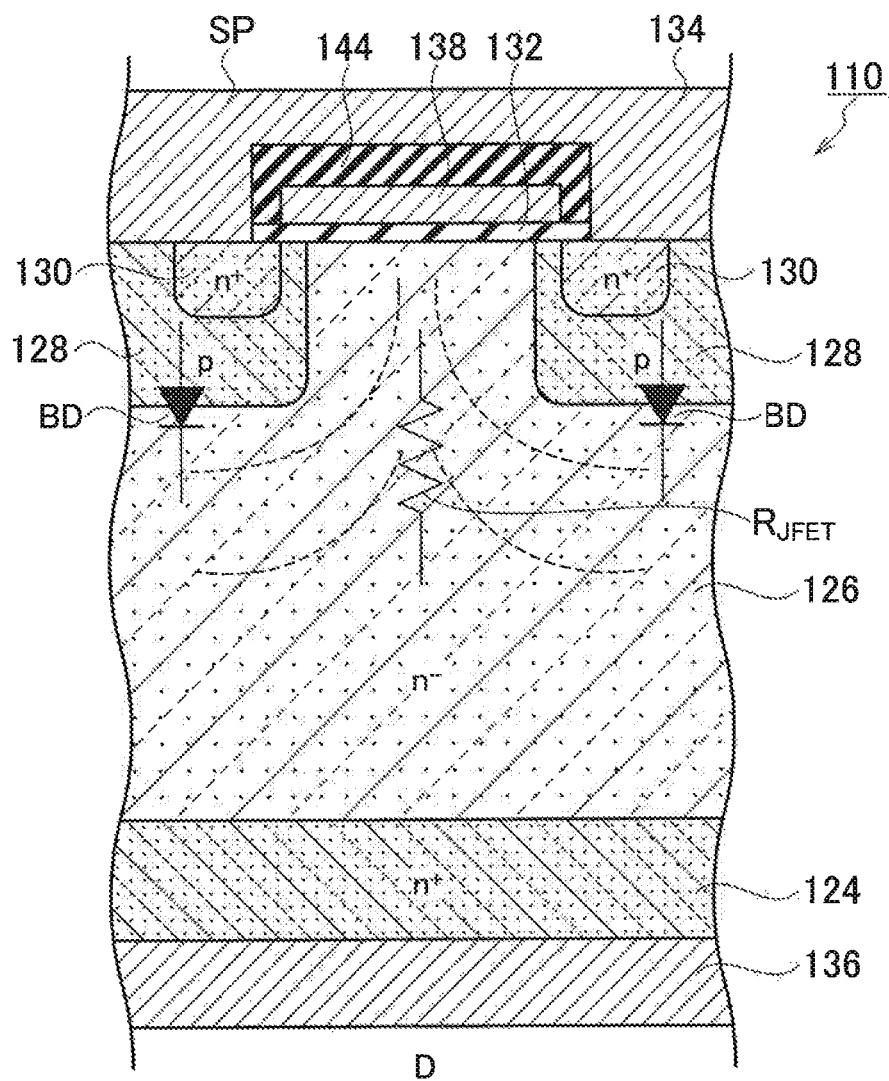
FIG. 26 is a schematic cross-sectional structure diagram of an SiC Double Implanted MISFET (SiC DIMISFET), which is an example of a semiconductor device which can be applied to the power module according to the embodiments.

FIG. 26 shows a schematic cross-sectional structure of an SiC DIMISFET, which is an example of a semiconductor device 110 which can be applied to the power module according to the embodiments.

As shown in FIG. 26, the SiC DIMISFET applicable to the power circuit according to the embodiments includes: a semiconductor substrate 126 composed of an n⁻ type high resistivity layer; a p body region 128 formed on a front surface side of the semiconductor substrate 126; an n⁺ source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an n⁺ drain region 124 disposed on a back side surface opposite to the surface of the semiconductor substrate 126; and a drain electrode 136 connected to the n⁺ type drain area 124.

In the semiconductor device 110 shown in FIG. 26, the p body region 128 and the n⁺ source region 130 formed on the front side surface of the p body region 128 are formed with double ion implantation (DI), and the source pad electrode SP is connected to the source region 130 and the source electrode 134 connected to the p body region 128. A gate pad electrode GP (not shown) is connected to the gate electrode 138 disposed on the gate insulating film 132. Moreover, as shown in FIG. 26, the source pad electrode SP and the gate pad electrode GP (not shown) are disposed on an interlayer insulating film 144 for passivation configured to cover the front side surface of the semiconductor device 110.

As shown in FIG. 26, in the SiC DIMISFET, since a depletion layer as shown with the dashed lines is formed in the semiconductor substrate 126 composed of a n⁻ type high resistivity layer inserted into the p body regions 128, channel resistance $R_{JFET}$ accompanying the junction type FET (JFET) effect is formed. Moreover, as shown in FIG. 26, body diodes BD are respectively formed between the p body regions 128 and the semiconductor substrates 126.

—SiC TMISFET—

Figure 27:
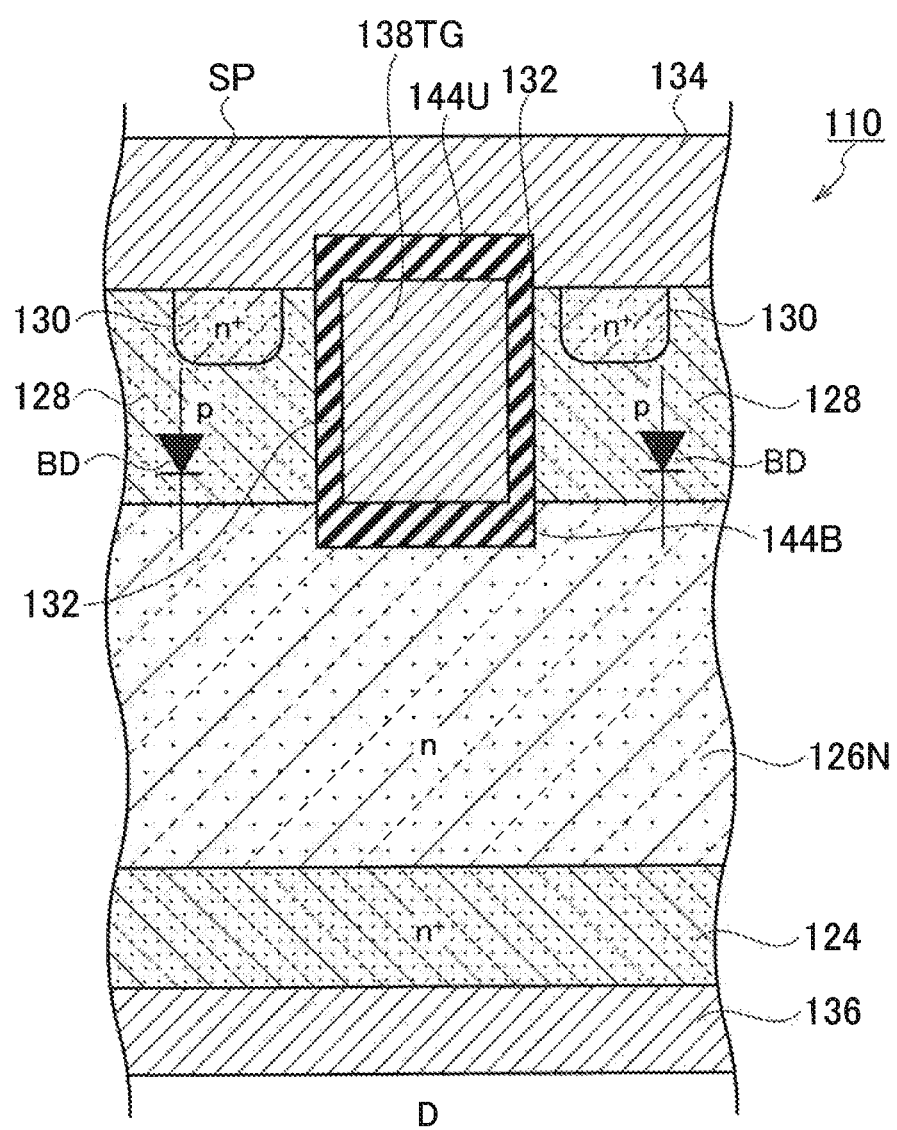
FIG. 27 is a schematic cross-sectional structure diagram of an SiC Trench MISFET (SiC TMISFET), which is an example of a semiconductor device which can be applied to the power module according to the embodiments.

FIG. 27 shows a schematic cross-sectional structure of an SiC TMISFET, which is an example of a semiconductor device 110 which can be applied to the power module according to the embodiments.

As shown in FIG. 27, the SiC TMISFET applicable to the power circuit according to the embodiments includes: a semiconductor substrate 126N composed of an n⁻ type high resistivity layer; a p body region 128 formed on a front surface side of the semiconductor substrate 126N; an n⁺ source region 130 formed on a front side surface of the p body region 128; a trench gate electrode 138TG passing through the p body region 128, the trench gate electrode 138TG formed in the trench formed up to the semiconductor substrate 126N via the gate insulating film 132 and the interlayer insulating films 144U, 144B; a source electrode 134 connected to the source region 130 and the p body region 128; an n⁺ type drain area 124 disposed on a back side surface of the semiconductor substrate 126N opposite to the front side surface thereof; and a drain electrode 136 connected to the n⁺ type drain area 124.

In the semiconductor device 110 shown in FIG. 27, a trench gate electrode 138TG passes through the p body region 128, and the trench gate electrode 138TG formed in the trench formed up to the semiconductor substrate 126N is formed via the gate insulating film 132 and the interlayer insulating films 144U, 144B, and the source pad electrode SP is connected to the source region 130 and the source electrode 134 connected to the p body region 28. A gate pad electrode GP (not shown) is connected to the gate electrode 138 disposed on the gate insulating film 132. Moreover, as shown in FIG. 27, the source pad electrode SP and the gate pad electrode GP (not shown) are disposed on an interlayer insulating film 144U for passivation configured to cover the front side surface of the semiconductor device 110.

In the SiC TMISFET, channel resistance $R_{JFET}$ accompanying the junction type FET (JFET) effect as the SiC DIMISFET is not formed. Moreover, body diodes BD are respectively formed between the p body regions 128 and the semiconductor substrates 126N, in the same manner as FIG. 2.

Figure 28A:
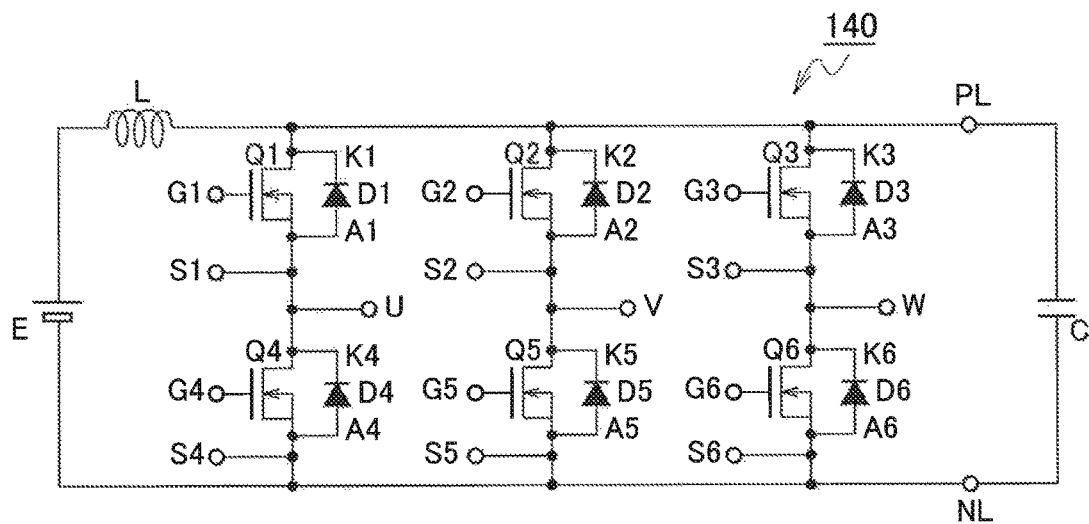
FIG. 28A shows an example of a circuit configuration in which the SiC MISFET is applied as a semiconductor device, and a snubber capacitor is connected between a power terminal PL and an earth terminal (ground terminal) NL, in a schematic circuit configuration of a three-phase alternating current (AC) inverter composed using the power module according to the embodiments.
Figure 28B:
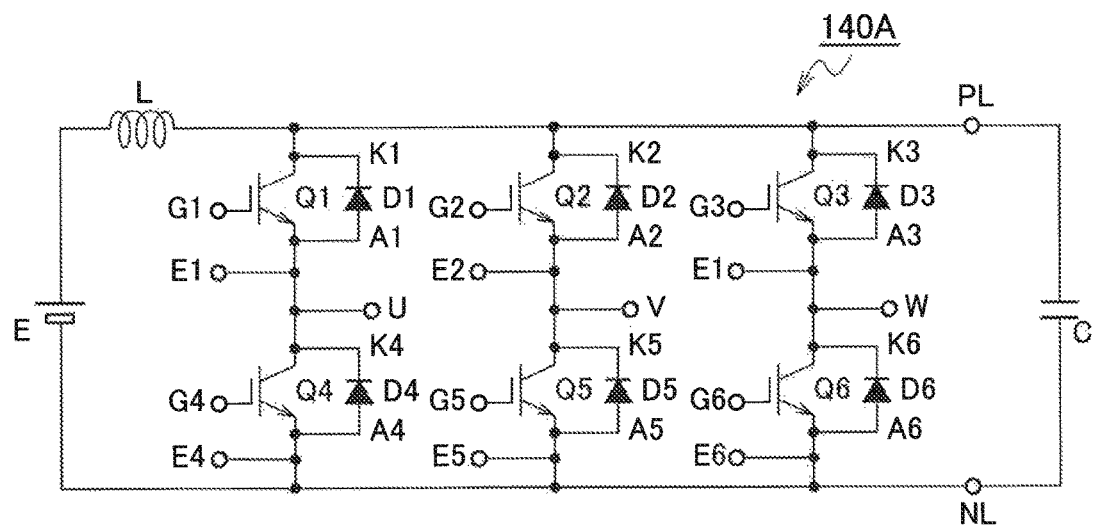
FIG. 28B shows an example of a circuit configuration in which the IGBT is applied as a semiconductor device, and the snubber capacitor is connected between the power terminal PL and the earth terminal (ground terminal) NL, in the schematic circuit configuration of a three-phase AC inverter composed using the power module according to the embodiments.

FIG. 28A shows an example of a circuit configuration in which the SiC MISFET is applied as a semiconductor device, and a snubber capacitor C is connected between the power terminal PL and the earth terminal (ground terminal) NL, in a schematic circuit configuration of a three-phase AC inverter 140 composed using the power module according to the embodiments. Similarly, FIG. 28B shows an example of a circuit configuration in which the IGBT is applied as a semiconductor device, and a snubber capacitor C is connected between the power terminal PL and the earth terminal (ground terminal) NL, in a schematic circuit configuration of a three-phase AC inverter 140A composed using the power module according to the embodiments. When connecting the power module according to the embodiments to the power source E, large surge voltage Ldi/dt is produced by an inductance L included in a connection line due to a high switching speed of the SiC MISFET and IGBT. For example, the surge voltage Ldi/dt is expressed as follows: Ldi/dt=3×10$^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

(Application Examples for Applying Power Module)

Next, there will now be explained the three-phase AC inverter 140 composed using the power module according to the embodiments to which the SiC MISFET is applied as the semiconductor device, with reference to FIG. 29.

Figure 29:
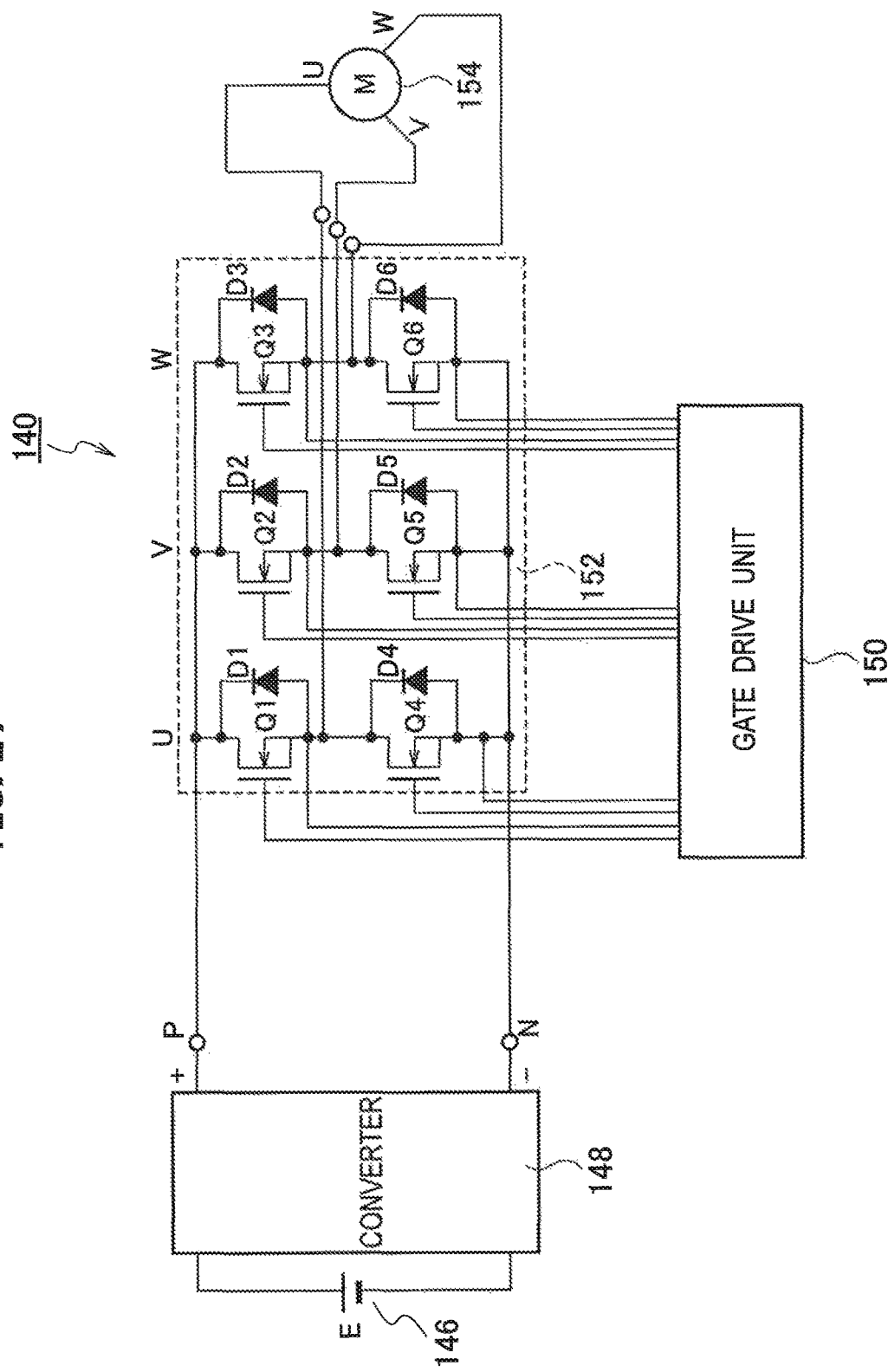
FIG. 29 is a schematic circuit configuration diagram of a three-phase AC inverter composed using the power module according to the embodiments to which the SIC MISFET is applied as the semiconductor device.

As shown in FIG. 29, the three-phase AC inverter 140 includes a gate drive unit 150, a power module unit 152 connected to the gate drive unit 150, and a three-phase AC motor unit 154. U-phase, V-phase, and W-phase inverters are respectively connected to the three-phase AC motor unit 154 so as to correspond to U phase, V phase, and W phase of the three-phase AC motor unit 154, in the power module unit 152. In this case, the gate drive unit 150 is connected to the SiC MISFETs Q1, Q4, SiC MISFETs Q2, Q5, and the SiC MISFETs Q3, Q6.

The power module unit 152 includes the SiC MISFETs Q1, Q4, and Q2, Q5, and Q3, Q6 having inverter configurations connected between a positive terminal (+) and a negative terminal (−) to which the converter 148 in a storage battery (E) 146 is connected. Moreover, flywheel diodes D1-D6 are respectively connected reversely in parallel between the source and the drain of the SiC MISFETs Q1-Q6.

Next, there will now be explained the three-phase AC inverter 140A composed using the power module 200T according to the embodiments to which the IGBT is applied as the semiconductor device, with reference to FIG. 30.

Figure 30:
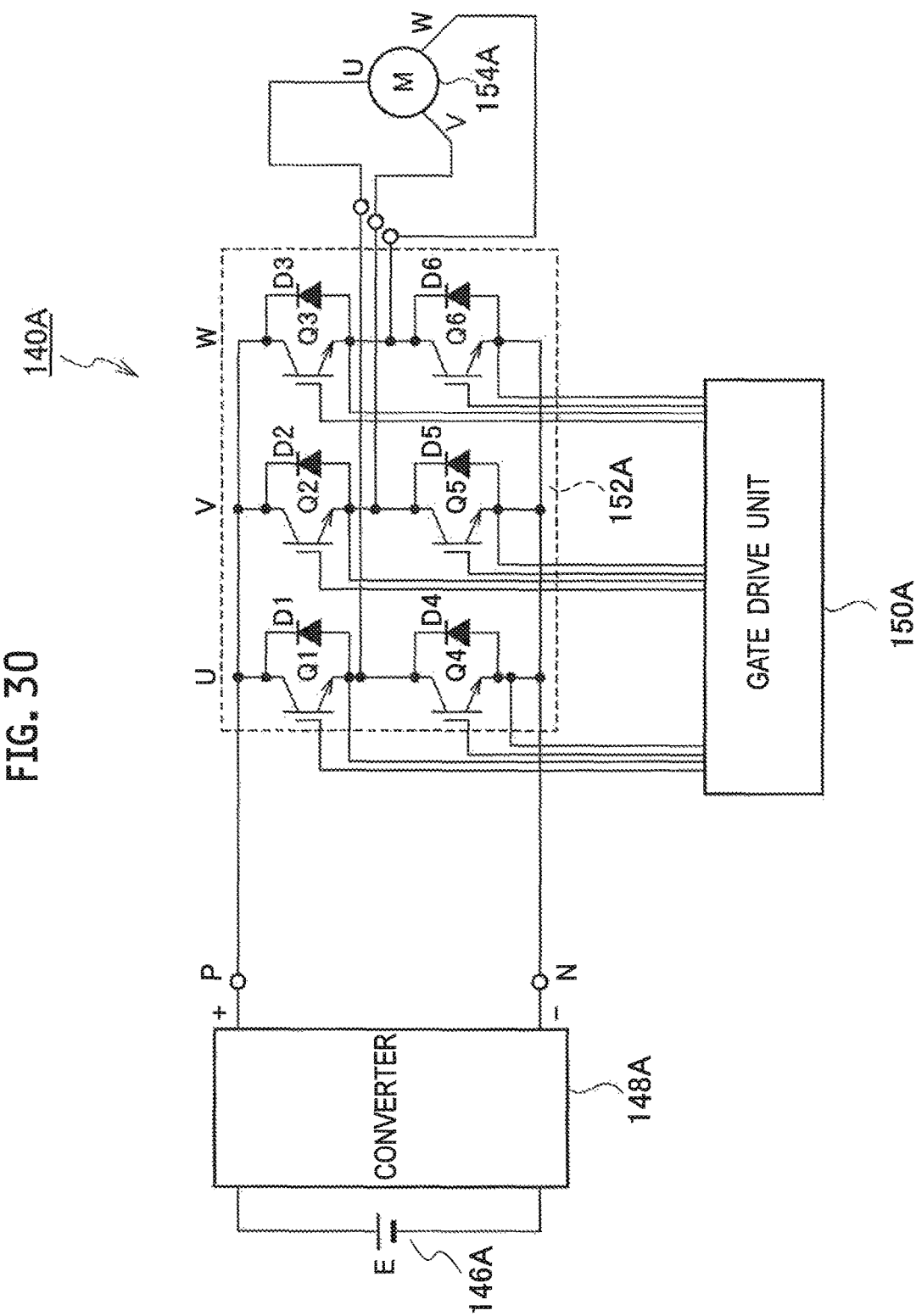
FIG. 30 is a schematic circuit configuration diagram of a three-phase AC inverter composed using the power module according to the embodiments to which the IGBT is applied as the semiconductor device.

As shown in FIG. 30, the three-phase AC inverter 140A includes a gate drive unit 150A, a power module unit 152A connected to the gate drive unit 150A, and a three-phase AC motor unit 154A. U-phase, V-phase, and W-phase inverters are respectively connected to the three-phase AC motor unit 152A so as to correspond to U phase, V phase, and W phase of the three-phase AC motor unit 154A, in the power module unit 152A. In this case, the gate drive unit 150A is connected to the IGBTs Q1, Q4, IGBTs Q2, Q5, and the IGBTs Q3, Q6.

The power module unit 152A includes the IGBTs Q1, Q4, and Q2, Q5, and Q3, Q6 having inverter configurations connected between a positive terminal (+) and a negative terminal (−) to which the converter 148A in a storage battery (E) 146A is connected. Furthermore, flywheel diodes D1-D6 are respectively connected reversely in parallel between the emitter and the collector of the IGBTs Q1-Q6.

The power module according to the embodiments can be formed as any one selected from the group consist of 1-in-1 module, 2-in-1 module, 4-in-1 module, 6-in-1 module, and 7-in-1 module.

As mentioned above, according to the embodiments, there can be provided the power module having the simplified structure, fabricated through the simplified process, and capable of conducting the large current; and the fabrication method for such a power module.

[Other Embodiments]

As explained above, the embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power module according to the embodiments can be used for manufacturing techniques for semiconductor modules, e.g. IGBT modules, diode modules, MOS modules (Si, SiC, GaN), etc., and can be applied to wide applicable fields, e.g. inverters for HEV/EV, inverter and converters for industrial applications, etc.

What is claimed is:

1. A power module comprising:
   a substrate;
   a first electrode pattern, a second electrode pattern, a first signal electrode pattern, and a second signal electrode pattern respectively disposed on the substrate;
   a semiconductor device disposed on a first surface of the second electrode pattern, the first surface being opposite to a second surface of the second electrode pattern on which the substrate is disposed; and
   a leadframe bonded to an upper surface of the semiconductor device, wherein
   the leadframe is divided into a plurality of leadframes, wherein
   the leadframe divided into the plurality of frames comprises:
      a first leadframe configured to conduct a principal current, the first leadframe being bonded to the first electrode pattern and the upper surface of the semiconductor device, and
      a second leadframe electrically insulated from the first leadframe, the power module further comprising:
      a first bonding wire connecting between the first leadframe and the first signal electrode pattern; and
      a second bonding wire connecting between the second leadframe and the second signal electrode pattern.

2. The power module according to claim 1, wherein assembling connection between the first leadframe and the second leadframe is performed via an insulating portion.

3. The power module according to claim 2, wherein the insulating portion comprises an epoxy based resin or a silicone based resin.

4. The power module according to claim 1, wherein the substrate comprises an insulating substrate.

5. The power module according to claim 4, wherein the insulating substrate comprises any one selected from the group consisting of a direct bonding copper substrate, a direct brazed aluminum substrate and an active metal bond substrate.

6. The power module according to claim 1, wherein the semiconductor device comprises a first pad electrode and a second pad electrode at a front surface side, wherein
   the first leadframe is bonded to the first electrode pattern and the first pad electrode, and
   the second leadframe is bonded to the second pad electrode.

7. The power module according to claim 1, wherein the first leadframe comprises any one selected from the group consisting of Cu, Al, a Cu alloy, an Al alloy, and an alloy containing at least one of the metals, and the second leadframe comprises any one selected from the group consisting of Cu, Al, and CuMo.

8. The power module according to claim 1, wherein the substrate comprises an organic insulating resin layer.

9. The power module according to claim 1, wherein the power module comprises any one selected from the group consist of 1-in-1 module, 2-in-1 module, 4-in-1 module, 6-in-1 module, and 7-in-1 module.

10. The power module according to claim 1, wherein the semiconductor device comprises any one selected from the group consist of IGBT, a diode, Si based MISFET, SiC based MISFET, and GaNFET.

11. The power module according to claim 1, wherein the first electrode pattern and the second electrode pattern are directly disposed on the substrate.

12. A power module comprising:
a substrate;
a first electrode pattern, a second electrode pattern, a first signal electrode pattern, and a second signal electrode pattern respectively disposed on the substrate;
a semiconductor device disposed on a first surface of the second electrode pattern, the first surface being opposite to a second surface of the second electrode pattern on which the substrate is disposed; and
a leadframe bonded to an upper surface of the semiconductor device, wherein
the leadframe is divided into a plurality of leadframes, wherein
the leadframe divided into the plurality of frames comprises:
  a first leadframe configured to conduct a principal current, the first leadframe being bonded to the first electrode pattern and the upper surface of the semiconductor device, and
  a second leadframe electrically insulated from the first leadframe, the power module further comprising:
  a third leadframe electrically connected to the first leadframe, the third leadframe being disposed on the first signal electrode pattern; and
  a fourth leadframe electrically connected to the second leadframe, the fourth leadframe being disposed on the second signal electrode pattern.

13. The power module according to claim 12, wherein a material of the third leadframe and a material of the first leadframe are the same.

14. The power module according to claim 12, wherein a material of the fourth leadframe and a material of the second leadframe are the same.

15. A power module comprising:
a substrate;
a first electrode pattern, a second electrode pattern, a first signal electrode pattern, and a second signal electrode pattern respectively disposed on the substrate;
a semiconductor device disposed on a first surface of the second electrode pattern, the first surface being opposite to a second surface of the second electrode pattern on which the substrate is disposed;
a leadframe bonded to an upper surface of the semiconductor device;
a first soldering layer disposed on the first pad electrode;
a stress relaxation layer disposed on the first soldering layer, the stress relaxation layer configured to relax a stress applied to the first soldering layer; and
a second soldering layer disposed on the stress relaxation layer,
wherein
the leadframe is divided into a plurality of leadframes, wherein
the leadframe divided into the plurality of frames comprises:
  a first leadframe configured to conduct a principal current, the first leadframe being bonded to the first electrode pattern and the upper surface of the semiconductor device, and
  a second leadframe electrically insulated from the first leadframe, wherein
the semiconductor comprises a first pad electrode and a second pad electrode at a front surface side, wherein
the first leadframe is bonded to the first electrode pattern and the first pad electrode,
the second leadframe is bonded to the second pad electrode, and
the first leadframe is connected to the first pad electrode via the stress relaxation layer.

16. The power module according to claim 15, wherein the stress relaxation layer is formed by including a metal layer having low coefficient of thermal expansion (CTE).

17. The power module according to claim 16, wherein the metal layer having low CTE comprises any one selected from the group consisting of CuMo, CuW, Mo, and W.

18. The power module according to claim 16, wherein the stress relaxation layer comprises any one selected from the group consisting of Cu, Al, covar, and invar.

* * * * *